(12) United States Patent
Elsherbini et al.

(10) Patent No.: US 11,270,947 B2
(45) Date of Patent: Mar. 8, 2022

(54) COMPOSITE INTERPOSER STRUCTURE AND METHOD OF PROVIDING SAME

(71) Applicant: Intel Corporation, Santa Clara, CA (US)

(72) Inventors: Adel Elsherbini, Tempe, AZ (US); Shawna Liff, Scottsdale, AZ (US); Johanna Swan, Scottsdale, AZ (US); Gerald Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 216 days.

(21) Appl. No.: 16/698,557

(22) Filed: Nov. 27, 2019

(65) Prior Publication Data

US 2021/0159179 A1 May 27, 2021

(51) Int. Cl.
*H01L 23/538* (2006.01)
*H01L 21/304* (2006.01)
(Continued)

(52) U.S. Cl.
CPC ...... *H01L 23/5385* (2013.01); *H01L 21/3043* (2013.01); *H01L 21/4846* (2013.01); *H01L 24/20* (2013.01)

(58) Field of Classification Search
CPC .......... H01L 23/5385; H01L 21/3043; H01L 21/4846; H01L 24/20; H01L 25/0655;
(Continued)

(56) References Cited

U.S. PATENT DOCUMENTS

2017/0229409 A1  8/2017 Hu
2017/0278806 A1*  9/2017 Kuo ............... H01L 23/49838
(Continued)

FOREIGN PATENT DOCUMENTS

EP   3416188   12/2018
EP   3748672   12/2020
WO  2019161641   8/2019

OTHER PUBLICATIONS

Extended European Search Report for European Patent Application No. 20193039.3, dated Feb. 12, 2021.

*Primary Examiner* — Thanh Y. Tran
(74) *Attorney, Agent, or Firm* — Essential Patents Group, LLP.

(57) ABSTRACT

Techniques and mechanisms for high interconnect density communication with an interposer. In some embodiments, an interposer comprises a substrate and portions disposed thereon, wherein respective inorganic dielectrics of said portions adjoin each other at a material interface, which extends to each of the substrate and a first side of the interposer. A first hardware interface of the interposer spans the material interface at the first side, wherein a first one of said portions comprises first interconnects which couple the first hardware interface to a second hardware interface at the first side. A second one of said portions includes second interconnects which couple one of first hardware interface or the second hardware interface to a third hardware interface at another side of the interposer. In another embodiment, a metallization pitch feature of the first hardware interface is smaller than a corresponding metallization pitch feature of the second hardware interface.

20 Claims, 16 Drawing Sheets

(51) Int. Cl.
*H01L 21/48* (2006.01)
*H01L 23/00* (2006.01)

(58) Field of Classification Search
CPC .................. H01L 24/97; H01L 24/09; H01L 2224/08146; H01L 2224/08235; H01L 2224/94; H01L 2224/08237; H01L 23/5384; H01L 23/5386; H01L 23/5383; H01L 25/50; H01L 23/485; H01L 2224/80896; H01L 23/481; H01L 2224/80001
See application file for complete search history.

(56) References Cited

U.S. PATENT DOCUMENTS

| | | | |
|---|---|---|---|
| 2018/0047663 A1* | 2/2018 | Camarota | ............... H01L 25/18 |
| 2019/0304911 A1 | 10/2019 | Collins et al. | |
| 2020/0098724 A1* | 3/2020 | Liff | .................... H01L 25/0652 |
| 2020/0098725 A1* | 3/2020 | Liff | ........................ H01L 24/16 |

* cited by examiner

COMPOSITE INTERPOSER STRUCTURE AND METHOD OF PROVIDING SAME

BACKGROUND

1. Technical Field

This disclosure generally relates to an integrated circuit package and more particularly, but not exclusively, to heterogeneous dielectric structures of an interposer.

2. Background Art

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate. However, this approach may be limited by the size of the mounting area and may not readily accommodate stacked die.

On the other hand, conventional wire-bonding approaches may limit the number of semiconductor die that can reasonably be included in a single semiconductor package. Furthermore, general structural issues may arise when attempting to package a large number of semiconductor die in a semiconductor package.

Newer packaging approaches, such as through silicon via (TSV) and silicon interposer, are gaining much attention from designers for the realization of high performance Multi-Chip Module (MCM) and System in Package (SiP). However, additional improvements are needed in the evolution of semiconductor packages.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
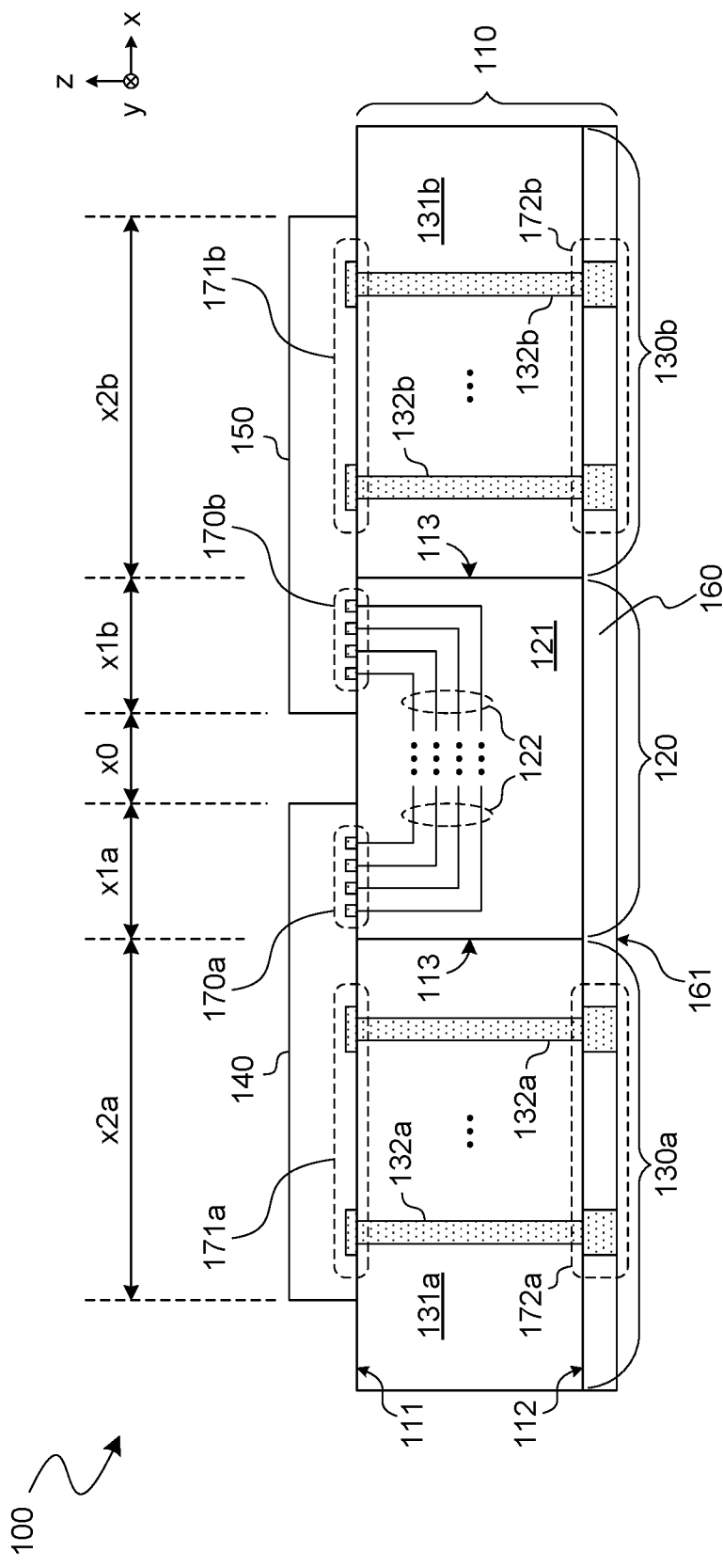
FIG. 1 is a cross-sectional side view diagram showing elements of a circuit device comprising an interposer according to an embodiment.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

It is pointed out that those elements of the figures having the same reference numbers (or names) as the elements of any other figure can operate or function in any manner similar to that described, but are not limited to such.

Embodiments discussed herein variously provide techniques and mechanisms for high interconnect density communication with an interposer. In some embodiments, fabrication of an interposer comprises adhering or otherwise bonding a chiplet to a substrate which comprises an inorganic material—e.g., one of a crystalline material (such as a monocrystalline silicon or other suitable semiconductor material) or an amorphous material such as a glass. After such bonding, additional fabrication forms an inorganic insulator structure (and interconnects variously extending therein), at least on some region of the substrate which adjoins the chiplet. In some embodiments, such additional fabrication (as compared to fabrication of the chiplet) is relatively low cost, fast and/or otherwise resource efficient—e.g., where interconnect density requirements for such additional fabrication are relatively low.

A first portion of the resulting interposer includes some or all structures of the chiplet, wherein a second portion of the interposer adjoins the first portion at a material interface which extends from the substrate to a side of the interposer. In one such embodiment, a first metallization feature pitch of the first portion is smaller than a corresponding second metallization feature pitch of the second portion.

As used herein, "hardware interface" refers to an arrangement of conductive contacts (e.g., including metal pins, pads, balls or other suitable conductor structures) by which one device is to be electrically coupled to another device. The phrase "material interface," as used herein, refers to a discontinuity between two materials. For example, a material interface in some embodiments is between two adjoining dielectric materials, which are different from each other. Alternatively or in addition, a material interface includes structural difference between adjoining portions of two insulator structures—e.g., wherein the same (or alternatively, different) dielectric materials adjoin each other at the material interface. As used herein, "composite interposer" refers to an interposer which includes two adjoining portions which adjoin one another at a material interface—e.g., wherein said material interface is a result of one such portion being fabricated prior to, and independent of, the other portion.

FIG. 1 shows features of a device 100 to enable communication between IC chips according to an embodiment. Device 100 is one example of an embodiment wherein a composite interposer provides coupling with at least two IC chips. As shown in FIG. 1, an interposer 110 of device 100 comprises a substrate 160 of an inorganic material (e.g., a glass or a crystalline material such as a monocrystalline silicon or other suitable semiconductor material). Interposer 110 further comprises a portion 120 disposed on substrate 160, the portion 120 to facilitate at least some electrical coupling between two IC chips. In some embodiments, a bonding interface (not shown) is between the substrate 160 and the portion 120—e.g., the bonding interface including silicon dioxide or silicon nitride. Another portion of interposer 110—such as the illustrative portion 130a shown—is also disposed on substrate 160, where portions 120, 130a each extend to a material interface 113. In an embodiment, a first hardware interface, which facilitates coupling of interposer 110 to a first IC chip, includes both conductive contacts at portion 120 and other conductive contacts of portion 130a. A second hardware interface, which facilitates coupling of interposer 110 to another IC chip, includes other conductive contacts at portion 120, wherein the first hardware interface and the second hardware interface are electrically coupled to each other via interconnects of portion 120. In one such embodiment, the first hardware interface is further electrically coupled, via other interconnects of portion 130a, to a third hardware interface of interposer 110.

By way of illustration and not limitation, portion 120 comprises an insulator structure 121 and interconnect structures 122 which variously extend therein. Insulator structure 121 includes one or more layers of an inorganic inter-layer dielectric (ILD) material such as, but not limited to, silicon oxides, carbon doped silicon oxides, silicon oxynitride, or silicon nitride—e.g., wherein insulator structure 121 comprises a low-k dielectric material, which extends to material interface 113. Interconnect structures 122 comprise one or more metallization layers, vias and/or other conductors, some or all of which are electrically coupled each between a respective contact of the first hardware interface and a respective contact of the second hardware interface.

Portion 130a comprises another insulator structure 131a and interconnect structures 132a which variously extend therein. In an embodiment, insulator structure 131a comprises one or more inorganic dielectric materials such as, but not limited to, silicon oxides, silicon oxynitride, or silicon nitride. In various embodiments, insulator structure 131a comprises only one layer of a dielectric material—e.g., wherein vias variously extend between sides 111, 112 of insulator structure 131a. Alternatively, insulator structure 131a comprises multiple layers each of a respective inorganic ILD. Although some embodiments are not limited in this regard, insulator structure 131a includes an artefact of one of a spin-on deposition technique or a sol-gel deposition technique, for example. Although interconnect structures 132a are illustrated as via structures which extend through insulator structure 131a, in other embodiments, portion 130a additionally or alternatively comprises electrically coupled metallization layers that variously extend each in a respective x-y plane of the xyz coordinate system shown.

Although some embodiments are not limited in this regard, interposer 110 further comprises another portion 130b including an insulator structure 131b and interconnect structures 132b which variously extend therein. In one such embodiment, portions 130a, 130b are respective sub-portions of a larger structure that extends around portion 120. For example, in some embodiments, insulator structure 131b is contiguous with, or otherwise comprises one or more features of, insulator structure 131a. Additionally or alternatively, interconnect structures 132b comprises one or more features of interconnect structures 132a.

The first hardware interface—e.g., by which interposer 110 is to couple to an IC chip 140—comprises conductive contacts 170a (for example, copper pads, copper pillars, solder interconnects or other such suitable conductive structures) at portion 120 and conductive contacts 171a at portion 130a. For example, in the example embodiment shown, portion 120 spans a region (x1a+x0+x1b)—along the x-dimension of the xyz coordinate system—including a surface region x0 which extends between IC chips 140, 150. Conductive contacts 170a are variously disposed, in or on a surface region x1a of side 111 which is formed with insulator structure 121, and which extends along the x-dimension of the xyz coordinate system shown. Similarly, conductive contacts 171a are variously disposed, in or on another surface region x2a of side 111 which is formed with insulator structure 131a, and which extends along the x-dimension. In such an embodiment, the first hardware interface spans material interface 113—e.g., wherein material interface 113 extends to a location at side 111 which is between regions x1a, x2a (and thus, between conductive contacts 170a and conductive contacts 171a).

The second hardware interface—e.g., by which interposer 110 is to couple to another IC chip 150—includes at least some conductive contacts, at portion 120, which are coupled to the first hardware interface via interconnects 122. By way of illustration and not limitation, the second hardware interface comprises conductive contacts 170b which are variously disposed, in or on another surface region x1b of side 111 which is formed with insulator structure 121. In some embodiments where interposer 110 further comprises portion 130b, the second hardware interface further comprises conductive contacts 171b at portion 130b. In the example embodiment shown, conductive contacts 171b are variously disposed, in or on another surface region x2b of side 111 which is formed with insulator structure 131b. In one such embodiment, the second hardware interface spans material interface 113—e.g., wherein material interface 113 also extends to another location at side 111 which is between regions x1b, x2b (and thus, between conductive contacts 170b and conductive contacts 171b).

In the example embodiment shown, portions 120, 130a are disposed on a side 112 of substrate 160, and interposer 110 further comprises a third hardware interface which is at an opposite side 161 of substrate 160. Such a third hardware interface facilitates coupling of device 100 to a package substrate or other structure (not shown) that is to function as a host component. By way of illustration and not limitation, the third hardware interface comprises conductive contacts 172a, which are positioned under portion 130a. In some embodiments where interposer 110 further comprises portion 130b, the third hardware interface further comprises conductive contacts 172b which are positioned under portion 130b. In one such embodiment, the third hardware interface is electrically coupled to the first hardware interface—e.g., wherein interconnect structures 132a are each coupled between a respective one of conductive contacts 171a and a respective one of conductive contacts 172a. Alternatively or in addition, the third hardware interface is electrically coupled to the second hardware interface—e.g., wherein interconnect structures 132b are each coupled between a respective one of conductive contacts 171b and a respective one of conductive contacts 172b.

In an embodiment, respective inorganic dielectrics of insulator structure 121 and insulator structure 131 adjoin each other at a material interface 113—e.g., wherein material interface 113 extends around portion 120 in at least some horizontal plane (orthogonal to the z-axis shown). Although some embodiments are not limited in this regard, material interface 113 comprises an artifact of cutting, grinding, polishing, etching (e.g., plasma etching, reactive ion etching, chemical etching or the like) and/or other processing which dices or otherwise singulates a chiplet that is to provide structures of portion 120. In one such embodiment, a surface of portion 120—e.g., a top surface which forms part of side 111 or a bottom surface which forms part of side 112—further comprises a respective artifact of cutting, grinding, polishing and/or other processing to thin or otherwise remove a substrate material. Alternatively or in addition, in some embodiments, a top surface of one of 130a, 130b (formed with an insulator structure thereof) includes an artefact of a dicing, cutting, grinding, polishing or other such process to form side 111.

In some embodiments, portion 120 comprises a semiconductor substrate (not shown)—e.g., wherein one or more interconnects of portion 120 further extend through said semiconductor substrate. In one such embodiment, portion 120 further comprises a device layer which is disposed between the semiconductor substrate and insulator structure 121. One or more passive circuit components and/or active circuit components of such a device layer are electrically coupled, for example, between the first hardware interface and the second hardware interface via interconnects 122. By way of illustration and not limitation, active circuit components of such a device layer comprise that of multiplexer circuitry, de-multiplexer circuitry, repeater circuitry and/or any of various circuit resources to facilitate signal communication between the first hardware interface and the second hardware interface. Some embodiments are not limited with respect to a particular functionality that is to be provided with active circuit components (if any) of portion 120. It is also to be appreciated that various embodiments are not limited with respect to a particular functionality that is to be provided with IC chip 140, 150.

Figure 2:
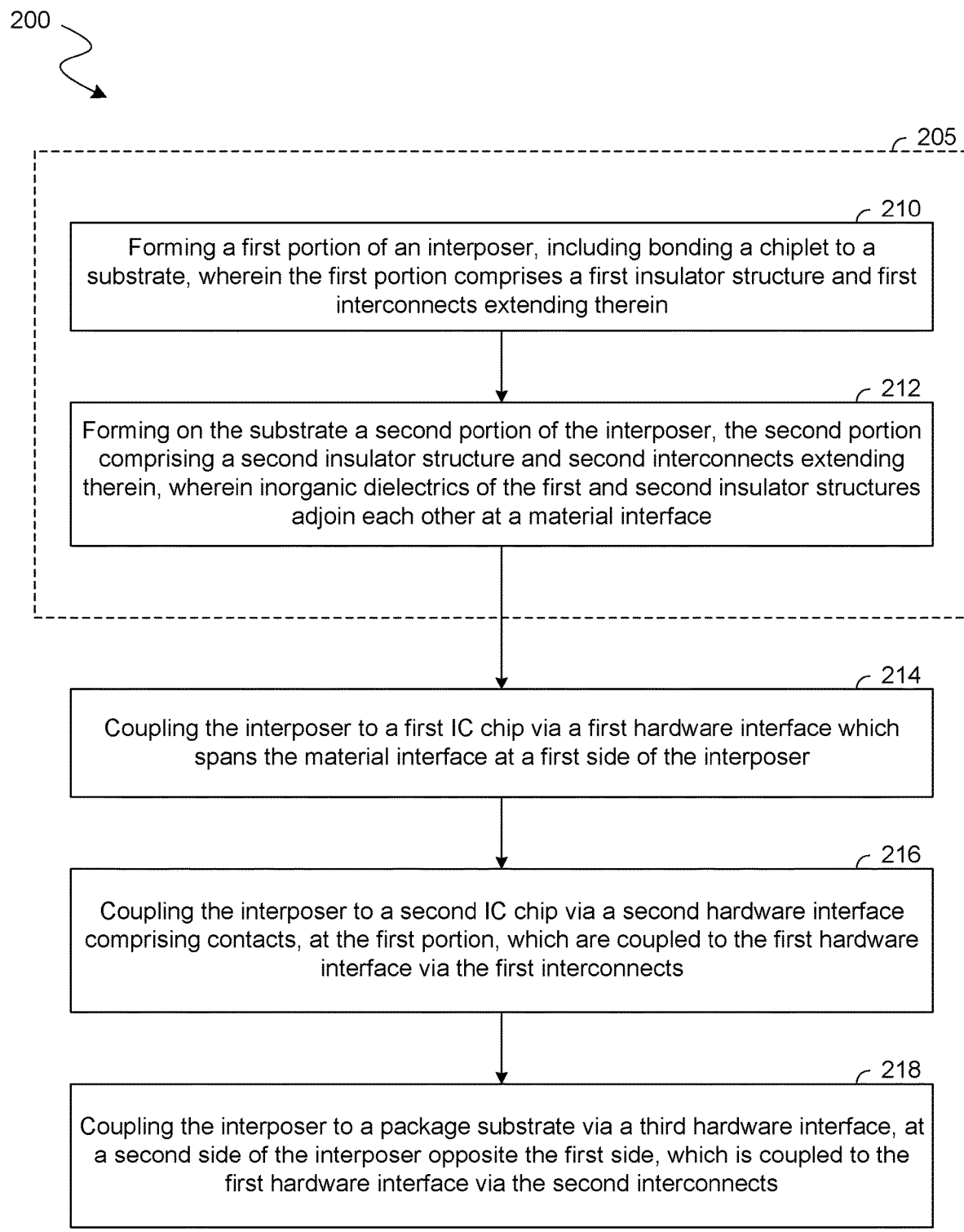
FIG. 2 is a flow diagram showing elements of a method to provide functionality of an interposer according to an embodiment.

FIG. 2 shows features of a method 200 to provide structures of an interposer according to an embodiment. In an embodiment, method 200 includes operations 205 to fabricate an interposer which, for example, provides some or all features of interposer 110. Additionally or alternatively, method 200 includes operations to couple said interposer to one or more circuit resources each via a respective hardware interface.

As shown in FIG. 2, operations 205 include (at 210) forming a first portion of an interposer, including bonding a chiplet to a substrate, which comprises an inorganic material. The first portion comprises a first insulator structure and first interconnects extending therein. In an embodiment, forming the first portion comprises thinning a semiconductor substrate of the chiplet—e.g., after the chiplet has been bonded to the substrate.

In various embodiments, the chiplet is received at operations 205 as a starting material. Alternatively, operations 205 further comprise fabricating the chiplet—e.g., wherein patterned metallization structures are formed, according to any suitable monolithic fabrication technique(s), on a wafer which is subsequently singulated to form said chiplet. In one such embodiment, passive devices and/or active devices are fabricated in or on a device layer of said wafer. The devices of any such device layer are variously interconnected, for example, with one or more lower metallization layers monolithically fabricated over the device layer during BEOL processing of the wafer.

In an embodiment, a singulated IC chiplet is attached to the substrate at 210. Chiplet attachment may comprise any alignment and bonding process suitable for the chiplet(s). For example, an IC chiplet of a relative large edge size may be handled and aligned to a target location on a substrate of a host wafer according to pick-and-place die assembly methods and systems. Many such methods and systems can handle an object as thin as 10 μm and with edge lengths ranging from tens of millimeters down to ~200 μm. Chiplet attachment may also comprise one or more micro device assembly techniques including so-called transfer printing methods, which are capable of handling an object as thin as 1 μm and having lateral dimensions in the tens of micrometers. Such micro device assembly techniques may rely on a MEMS microtool that includes hundreds or even thousands of die attachment points. Micro device assembly methods and systems suitable for inorganic LED (iLED) technology, for example, may be employed at 210 to transfer a plurality of IC chiplets en masse from a source substrate to the host wafer.

To facilitate the bonding at 210, the chiplet may be aligned to a target location on the host wafer by any of various commercially available, high resolution alignment tools used, for example, in wafer-level or chip-level bonding tool. Alignment capability continues to advance, having improved from +/−5 μm to +/−sub-1 μm over recent years. Once adequately aligned, the chiplet may be bonded to the host wafer with any suitable direct bonding technique(s). Direct bonding may include any of various suitable dielectric-dielectric bonding—e.g., oxide-oxide bonding techniques, for example. In some embodiments, direct bonding additionally or alternatively comprises metal-to-metal bonding during which metal of a feature in an upper most metallization layer of the chiplet sinters with metal of a feature in an upper most metallization layer of the substrate.

In some embodiments, the chiplet is bonded to the substrate through a hybrid bond in which a bond is formed both between metallization features (e.g., via metal interdiffusion) and between dielectric materials (e.g., via Si—O—Si covalent bonds) of the substrate and the chiplet. Thermocompression bonding may be at low temperature (e.g., below melting temperature of the interconnects, and more specifically below 100° C.). Direct bonding at room temperature (through placement with or without high force without applying heat) is also possible. Prior to bonding, either or both of substrate or chiplet may be pre-processed, for example with a plasma clean, to activate their surfaces for the bonding. Post bonding, selective or mass heating may be performed, to make permanent the bond (e.g., by strengthening the covalent oxide to oxide bond and/or the metallic Cu—Cu bond through interdiffusion). For selective heating, a heat mask or laser heating may be employed to limit the heat to the specific chiplet locations.

Operations 205 further comprise (at 212) forming on the substrate a second portion of the interposer, the second portion comprising a second insulator structure and second interconnects extending therein. Respective inorganic dielectrics of the first insulator structure and the second insulator structure adjoin each other at a material interface of the interposer. In an embodiment, the material interface extends to each of the substrate and a first side of the interposer—e.g., wherein at least two hardware interfaces of the interposer are variously formed in or on the first side.

In some embodiments, the forming at 212 comprises depositing a dielectric material over at least some portion of the substrate which extends to, but is not covered by, the chiplet—e.g., wherein the dielectric material is further deposited over the chiplet. For example, such a dielectric material is applied at 212 to substantially backfill portions of the substrate where no chiplet is present. Noting that the chiplet may be thick at this point (e.g., 200 µm, or more), multiple dielectric layers may be deposited and/or the dielectric material composition(s) and/or the dielectric material application technique(s) may be selected to achieve layer thicknesses significantly greater than those of a typical BEOL ILD layer. Additionally or alternatively, a grind and/or polish process may be subsequently performed to advantageously expose a backside (or alternatively, a front side) of the chiplet—e.g., where the chiplet may be thinned by continuing the grind/polish until chiplet substrate thickness has been reduced by some predetermined amount that will achieve sufficient planarity to permit a continuation of photolithographic patterning techniques typical of monolithic BEOL metallization processes.

In one such embodiment, the forming at 212 further comprises metallization processing to form electrical connections to the substrate through the one or more dielectric materials which are deposited adjacent to the bonded chiplet. In exemplary embodiments, these electrical connections comprise conductive vias that extend through an overall thickness of the one or more dielectric materials. The conductive vias may be fabricated according to any suitable BEOL wafer-level processes. For example, any suitable photosensitive mask material may be deposited over the bonded chiplet, and over the adjacent insulator structure. A lithographic process may be utilized to pattern a via mask, and an anisotropic plasma etch performed to transfer the via mask pattern through the planarized insulator structure adjacent to the bonded chiplet. Upon exposing features in an uppermost one of the lower metallization layers of the substrate, the via openings may be filled with conductive material (e.g., a metal such as Cu) and the conductive material planarized with a surface of the chiplet and the insulator structure.

In various embodiments, method 200 additionally or alternatively comprises (at 214) coupling the interposer to the first IC chip via a first hardware interface of the interposer—e.g., where said first hardware interface spans the material interface at the first side. In one such embodiment, method 200 further comprises (at 216) coupling the interposer to the second IC chip via a second hardware interface of the interposer. For example, the second hardware interface includes at least some conductive contacts, at the first portion, which are coupled to the first hardware interface via the first interconnects.

In an example embodiment, the first hardware interface comprises first contacts at the first portion, and second contacts at the second portion—e.g., wherein a first metallization feature pitch of the first contacts is smaller than a corresponding second metallization feature pitch of the second contacts. Additionally or alternatively, the second hardware interface comprises third contacts at the first portion, and fourth contacts at the second portion—e.g., wherein a third metallization feature pitch of the third contacts is smaller than a corresponding fourth metallization feature pitch of the fourth contacts.

In some embodiments, method 200 additionally or alternatively comprises (at 218) coupling the interposer to a package substrate via a third hardware interface of the interposer. The third hardware interface, which includes conductive contacts at a second side of the interposer (the second side opposite the first side), is coupled to the first hardware interface via the second interconnects. In one such embodiment, the third hardware interface is further coupled to the second hardware interface via other interconnects of the second portion that also extend through the second insulator structure.

Although some embodiments are not limited in this regard, the first portion further comprises passive circuit components and/or active circuit components which (for example) are coupled, via the first interconnects, between the first hardware interface and the second hardware interface. For example, the first portion comprises a semiconductor substrate and a device layer disposed thereon—e.g., wherein the first interconnects include or otherwise couple to one or more TSV structures which extend through the semiconductor substrate. Additionally or alternatively, the second portion further comprises passive circuit components and/or active circuit components which (for example) are coupled, via the second interconnects, between the first hardware interface and the third hardware interface.

Figure 3:
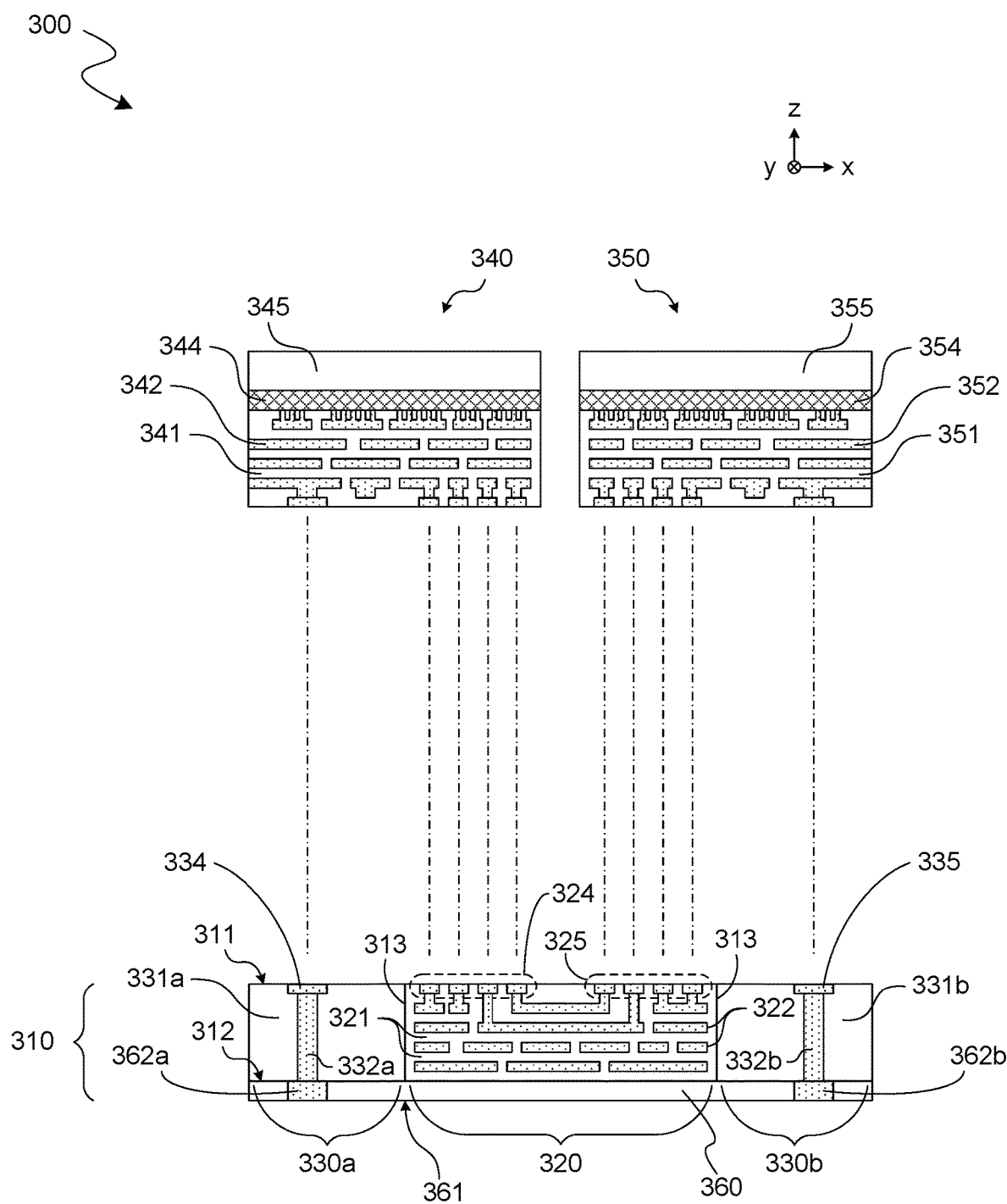
FIG. 3 is an exploded cross-sectional side view diagram of a device comprising an interposer according to an embodiment.

FIG. 3 shows an exploded view of a device 300 comprising a composite interposer according to an embodiment. Functionality of device 300 is provided according to some or all of method 200, in some embodiments.

As shown in FIG. 3, device 300 comprises an interposer 310 and IC chips 340, 350 which are coupled thereto—e.g., wherein interposer 310, IC chip 340 and IC chip 350 correspond functionally to interposer 110, IC chip 140 and IC chip 150 (respectively). IC chip 340 comprises a semiconductor layer 345 and a device layer 344 fabricated therein or thereon, where the device layer 344 comprises any of a variety of active devices and/or passive devices. Said devices of device layer 344 are coupled to one another via interconnected metallization layers 342 which variously extend in dielectric layer 341 of IC chip 340.

Similarly, IC chip 350 comprises a semiconductor layer 355 and a device layer 354 comprising active devices and/or passive device variously disposed on semiconductor layer 355. Interconnected metallization layers 352, variously extending in dielectric layers 351 of IC chip 350, facilitate coupling to and/or between devices of device layer 354. In one example embodiment, IC chips 340, 350 comprise one or more processor cores, memory arrays and/or any of various other circuit resources. However, various embodiments, though facilitating communication between respective circuit resources of IC chips 340, 350, are not limited to a particular functionality that is to be provided with such circuit resources based on said communication.

Interposer 310 comprises a substrate 360, and portions 320, 330a, 330b variously disposed thereon. Portion 320 (providing functionality of portion 120, for example) comprises dielectric layers 321 and interconnect structures 322 which variously extend therein—e.g., wherein interconnect structures 322 provide electrical coupling between conductive contacts 324, 325 which are variously disposed in or on a side 311 of interposer 310. In various embodiments, some or all of interconnect structures 322 each extend both to a respective one of conductive contacts 324 and to a respective one of conductive contacts 325. However, in an alternative embodiment, portion 320 further comprises passive components and/or active components which are variously coupled, via interconnect structures 322, between conductive contacts 324 and conductive contacts 325.

Portions 330a, 330b (e.g., providing functionality of portions 130a, 130b, respectively) comprise respective insulator structures 331a, 331b that variously extend, along portion 320, between side 311 and a side 312 of substrate 360. Portion 330a further comprises one or more interconnect structures (such as the illustrative via 332a shown), that extend in insulator structure 331a—e.g., wherein one or more interconnect structures of portion 330b (such as the illustrative via 332b shown), variously extend in insulator structure 331b.

A first hardware interface of interposer 310, by which interposer 310 is coupled to IC chip 340, comprises both conductive contacts 324 at portion 320 and one or more other conductive contacts (e.g., including the illustrative conductive contact 334 shown) at portion 330a. A second hardware interface, by which interposer 310 is coupled to IC chip 350, comprises both conductive contacts 325 at portion 320 and one or more other conductive contacts (e.g., including the illustrative conductive contact 335 shown) at portion 330b. In one such embodiment, interposer 310 further comprises a third hardware interface at a bottom side 361 of substrate 360. For example, said third hardware interface comprises conductive contacts 362a, 362b which are electrically coupled, by vias 332a, 332b, to contacts 334, 335 (respectively).

In some embodiments, insulator structure 331a extends to adjoin dielectric layers 321 at material interface 313 on one sidewall of portion 320—e.g., wherein insulator structure 331b extends to adjoin dielectric layers 321 at another region of material interface 313, which is on an opposite sidewall of portion 320. In one such embodiment, material interface 313 is an artefact of processing wherein portions 330a, 330b are formed on substrate 360 after an earlier bonding or other formation of portion 320 on substrate 360. Such processing enables different semiconductor fabrication processes to be used for various interposer portions. For example, some embodiments enable metallization features of portion 330a and/or portion 330b to be fabricated by processing which is relatively low cost and/or otherwise resource efficient—e.g., as compared to alternative processing which is used to form lower pitch metallization features of portion 320.

FIGS. 4A-4G show stages 400-405 of fabrication to variously couple IC chips via structures of an interposer according to an embodiment. Processing such as that illustrated by stages 400-405 provides features of interposer 110—e.g., where such processing includes some or all of method 200.

Figure 4A:
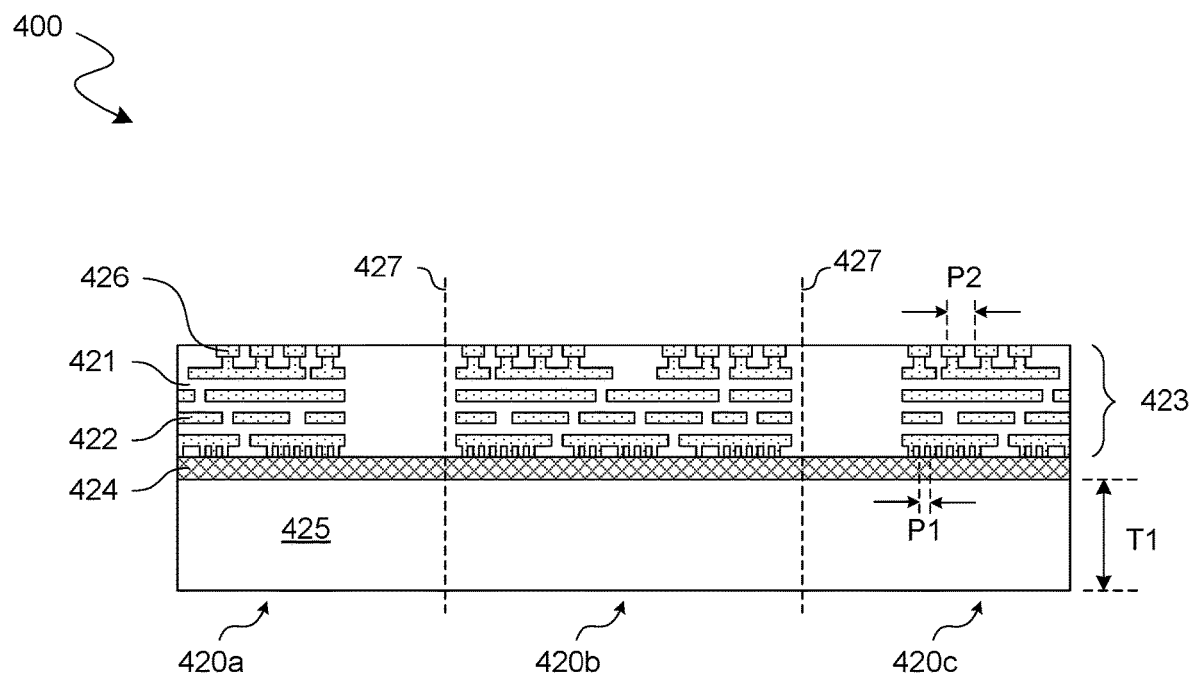
FIGS. 4A-4G are cross-sectional side view diagrams showing stages of processing to provide connectivity with an interposer according to an embodiment.

FIG. 4A shows a cross-sectional illustration of a chiplet wafer, at stage 400, that may be received as a starting material, or fabricated in a first monolithic IC process. The chiplet wafer comprises a plurality of sections 420a, 420b, 420c that are to be singulated, along scribe lines 427, to form respective chiplets. The chiplet wafer includes at least one device layer 424 that is between a substrate 425, and one or more BEOL metallization layers 423 that have been monolithically fabricated over device layer 424. In various other embodiments, more than one device layers are formed on substrate 425 and/or a device layer is formed in or on some or all of BEOL metallization layers 423. Substrate 425 may be homogenous with device layer 424, or not (e.g., a transferred substrate). In wafer form, substrate 425 may have any thickness T1 sufficient for providing adequate mechanical support during monolithic fabrication of chiplet circuitry. In some exemplary embodiments, thickness T1 is between 200 and 700 µm.

Device layer 424 (and a homogeneous substrate 425) may include any semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, the semiconductor material is a Group III-V material comprising a Group III majority constituent and a Group IV majority constituent (e.g., InGaAs, GaAs, GaSb, InGaSb). Device layer 424 may have a thickness of 100-1000 nm, for example. Device layer 424 need not be a continuous layer of semiconductor material, but rather may include active regions of semiconductor material surrounded by field regions of isolation dielectric. During front-end-of-line (FEOL) processing, active and/or passive devices are fabricated in device layer 424 at some device density associated with device pitch P1. In some embodiments, the active devices are field effect transistors (FETs) with a device pitch P1 of 80 nm, or less, for example. The FETs may be of any architecture (e.g., planar, non-planar, single-gate, multi-gate). In some embodiments, FET terminals have a feature pitch of 40-80 nm. Additionally, or in the alternative, device layer 424 may include active devices other than FETs. For example, device layer 424 may include electronic memory structures, such as magnetic tunnel junctions (MTJs), or the like. In addition to active devices, or instead of active devices, device layer 424 may include passive devices (e.g., resistors, capacitors, inductors, etc.).

During back-end-of-line (BEOL) processing, active devices of device layer 424 are interconnected into chiplet circuitry with one or more chiplet metallization layers 423. In some examples where device layer 424 includes both n-type and p-type FETs, the FETs are interconnected by metallization layers 423 into a CMOS circuit. Metallization layers 423 may comprise any number of interconnect structures 422 which, for example, are separated by inter-level dielectric (ILD) layers 421. Layer thicknesses (along the z-dimension) for both interconnect structures 422 and ILD layers 421 may range from 50 nm in the lower metallization layers near the interface with device layer 424, to 5 µm, or more, in the upper metallization layers. Interconnect structures 422 may have any composition known to be suitable for monolithic integrated circuitry, such as, but not limited to, Cu, Ru, Ti, Ta, Co, their alloys, or nitrides. ILD layers 421 may be of any material composition known to be suitable as an insulator of monolithic integrated circuitry, such as, but not limited to, silicon dioxide, silicon nitride, silicon oxynitride, or a low-k material having a relative permittivity below 3.5. In some embodiments, ILD materials between metallization layers 423 vary in composition with a lower one of ILD layers 421 comprising a low-k dielectric material and an uppermost one of ILD layers 421 comprising a conventional dielectric material (e.g., having a dielectric constant of approximately 3.5, or more). Confining low-k dielectric materials from a bond interface in this manner may advantageously improve bond strength and/or quality. In other embodiments where low-k dielectric material is able to form a strong bond interface, all ILD layers 421 may be a low-k material (e.g., having a relative permittivity of 1.5-3.0).

An uppermost one of metallization layers 423 includes conductive contacts 426, which have an associated chiplet interface feature pitch P2. Conductive contacts 426 may have any composition and dimension suitable for directly bonding to complementary conductive features of a host IC chip. In exemplary embodiments, chiplet interface feature pitch P2 is larger than feature pitch P1. Chiplet interface feature pitch P2 may range from 100 nm to several microns, for example. Where the wafer includes multiple metallization layers, each metallization layer may have an associated feature pitch that increments up from feature pitch P1 toward feature pitch P2.

Figure 4B:
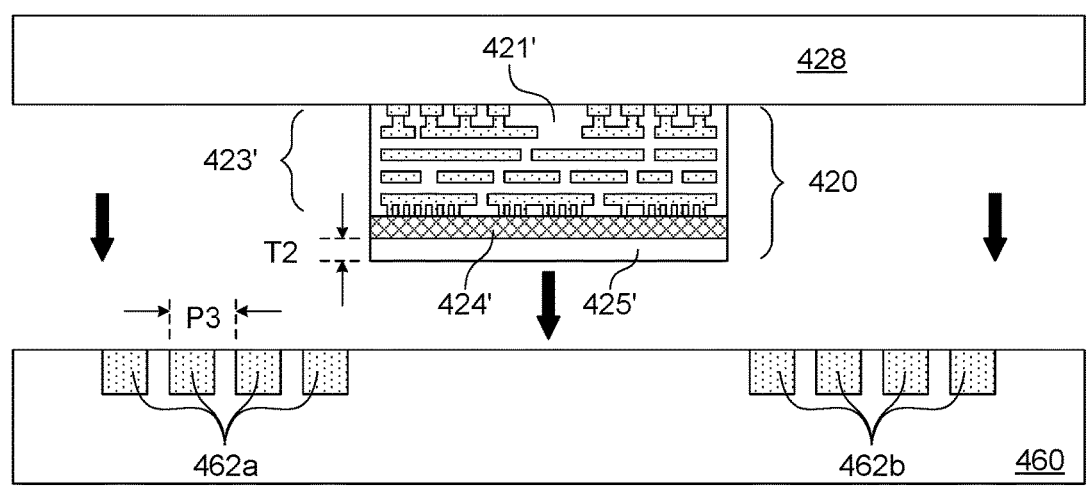

At the stage 401 shown in FIG. 4B, following singulation of the chiplet wafer, a resulting chiplet 420 (formed from one of sections 420a, 420b, 420c) is aligned with, and attached to, a substrate 460. For example, chiplet 420 is coupled to a region of substrate 460 which is between via structures 462a and via structures 462b that are variously formed in substrate 460. In one such embodiment, some or all of via structures 462a, 462b have a feature pitch P3 that (for example) is larger than feature pitch P2.

Chiplet 420 comprises dielectric layers 421', metallization layers 423', a device layer 424', and a semiconductor layer 425' which are formed by a dicing or other cutting of dielectric layers 421, metallization layers 423, device layer 424, and substrate 425 (respectively) through scribe lines 427. In an embodiment, semiconductor layer 425' is further formed by a planarization and/or other subtractive process, which removes a portion of substrate 425 from one of sections 420a, 420b, 420c after singulation thereof. For example, thinning from a back side surface of chiplet 420, reduces thickness T1 to a significantly smaller thickness T2. In some embodiments where thickness T1 was over 200 for example, thickness T2 is less than 100 μm (e.g., 20-80 μm). Thickness T2 may be as little as a few microns as limited by variation in chiplet bond heights and other sources of non-planarity across substrate 460, as well as the impacts of mechanical stress on the devices, and thermal spreading considerations. In some embodiments, chiplet 420 has additional mechanical support structures (not shown) at stage 401—e.g., including a thicker substrate portion and a release layer—that are subsequently removed after chiplet placement.

In exemplary embodiments, substrate 460 has formed therein streets (not shown) demarking where substrate 460 is to be scribed during a subsequent singulation process. In wafer form, substrate 460 may have any (z-dimension) thickness that is sufficient for providing adequate mechanical support during monolithic fabrication of interconnect structures and/or other circuitry therein or thereon. In some exemplary embodiments, such a thickness is between 200 and 700 μm. As further shown in FIG. 4B, chiplet 420 is positioned using a carrier wafer 428 (and/or with a pick-and-place microtool, for example) which is suitable coupling chiplet 420 to substrate 460. In some embodiments, chiplet 420 has an edge length (along the x-dimension shown) 1 mm, or more—e.g., with 1-5 μm of error attributable to die scribe. Chiplets of micron lateral dimensions are also possible. Hence, chiplet 420 may have an area that varies widely (e.g., 0.25-50 mm$^2$).

Figure 4C:
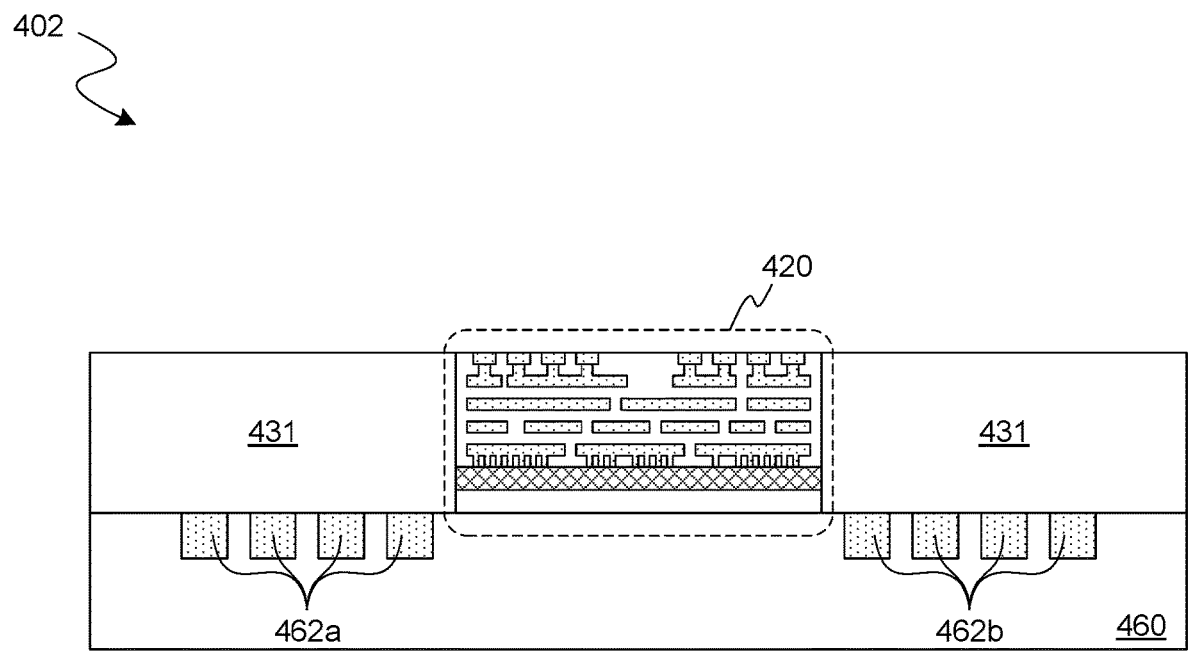

At the stage 402 shown in FIG. 4C, chiplet 420 is bonded to a region of substrate 460 which is between via structures 462a and via structures 462b. Although in the illustrated example there is a 1:1 correspondence between chiplet and substrate, any number of chiplets may be bonded to a single substrate as a function of the substrate and chiplet footprints and/or other architecture objectives. Subsequently, a dielectric material 431 is deposited at one or more sides of (e.g., around) chiplet 420—e.g., where dielectric material 431 covers a backside of substrate 460 and/or encapsulates chiplet 420. Although a single dielectric material 431 is shown, multiple dielectric material layers may be applied at a given side of chiplet 420. For example, a first conformal dielectric material layer may be deposited to contact a sidewall of chiplet 420 and a non-conformal, planarizing dielectric material layer may then be deposited over the conformal dielectric material layer. In some embodiments, dielectric material 431 comprises one or more inorganic dielectric materials such as, but not limited to, silicon oxides (B/PSG, carbon-doped silicon oxide), silicon oxynitride, or silicon nitride. At least one dielectric material 431 is applied, for example, with a spin-on technique or and/or a sol-gel technique to substantially cover chiplet 420. In some embodiments, grinding, polishing and/or other planarization is performed to remove that portion of dielectric material 431 (if any) which extends vertically above chiplet 420.

Figure 4D:
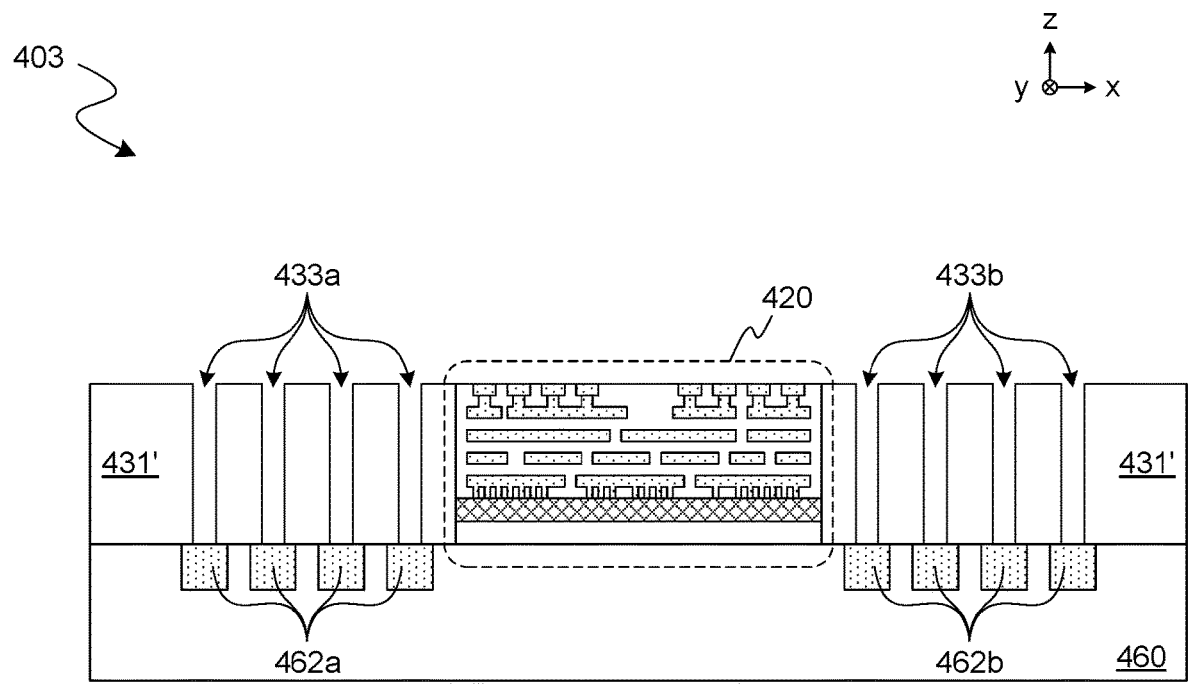
Figure 4E:
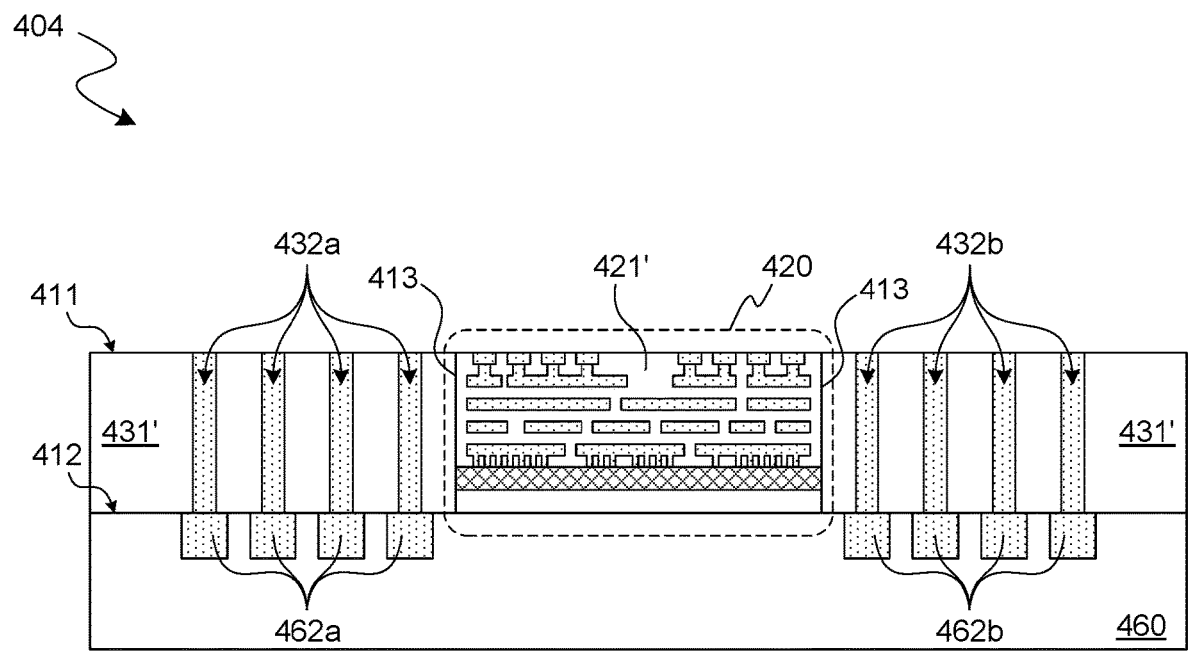
Figure 4F:
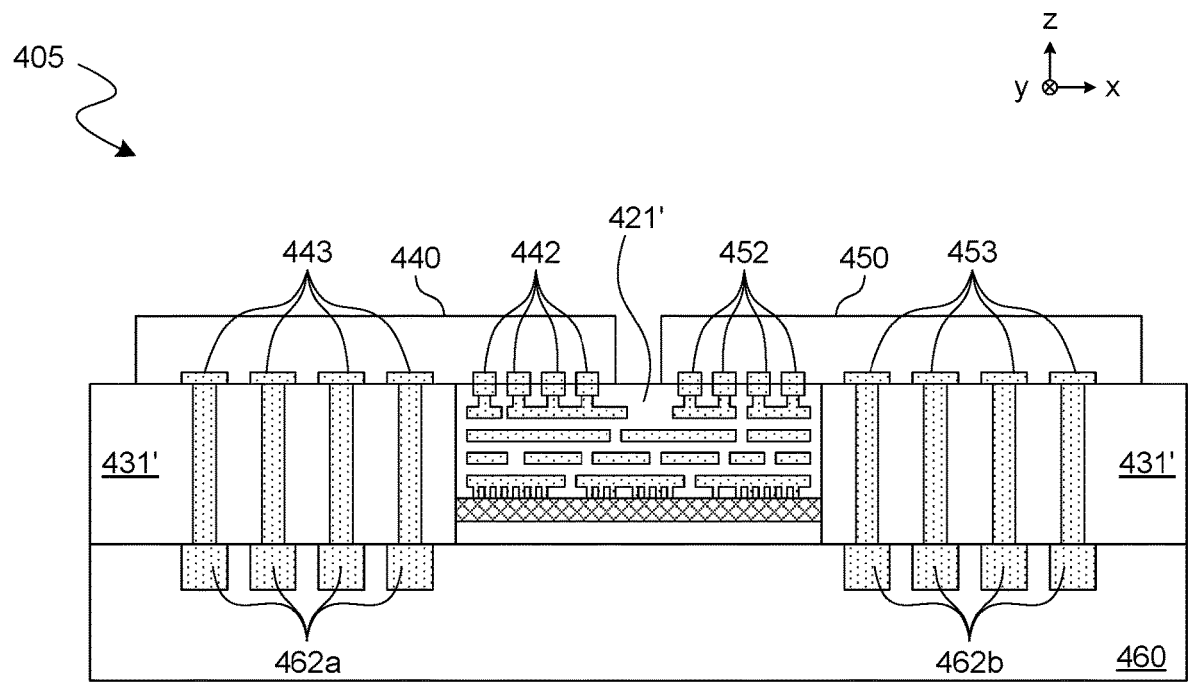

In the example illustrated with stages 403-405 shown in FIGS. 4D-4F, additional fabrication processing forms interconnect structures that variously extend along a vertical (z-axis) distance that is also spanned by chiplet 420. By way of illustration and not limitation, at stage 403, an insulator structure 431' is formed from dielectric material 431 by selectively etching and/or otherwise patterning holes 433a and/or holes 433b, which extend through to substrate 460. For example, holes 433a variously extend to expose respective ones of via structures 462a, wherein holes 433b variously extend to expose respective ones of via structures 462b. In an embodiment, formation of holes 433a, 433b includes one or more mask deposition, lithographic etch and/or other suitable processes that, for example, are adapted from conventional semiconductor fabrication techniques.

Subsequently, sputtering, electro-plating, electroless plating, chemical vapor deposition and/or any of various other suitable metal deposition operations is performed to form interconnect structures 432a each in a respective one of holes 433a and/or to form interconnect structures 432b each in a respective one of holes 433b. At stage 404, a material interface 413 is located between chiplet 420 and dielectric material 431 at stage 404, wherein material interface 413 extends from a surface 412 of substrate 460 to a side 411 which is formed at least in part by some or all of dielectric material 431, interconnect structures 432a, and interconnect structures 432b. In an embodiment, material interface 413 includes or otherwise delimits a maximum horizontal extent (in the x-y plane) of some or all of dielectric layers 421', metallization layers 423', a device layer 424', and semiconductor layer 425'.

At stage 405, additional metal deposition forms conductive contacts 443 each on a respective one of interconnect structures 432a—e.g., wherein conductive contacts 453 are further formed each on a respective one of interconnect structures 432a, and wherein conductive contacts 442, 452 are further formed each to facilitate connectivity with metallization layers 423' of chiplet 420. A first hardware interface, comprising conductive contacts 442 and conductive contacts 443, enables coupling of an IC chip, such as the illustrative IC chip 440, at side 411. A second hardware interface, comprising conductive contacts 452 and conductive contacts 453, enables coupling to another IC chip 450 at side 411.

Figure 4G:
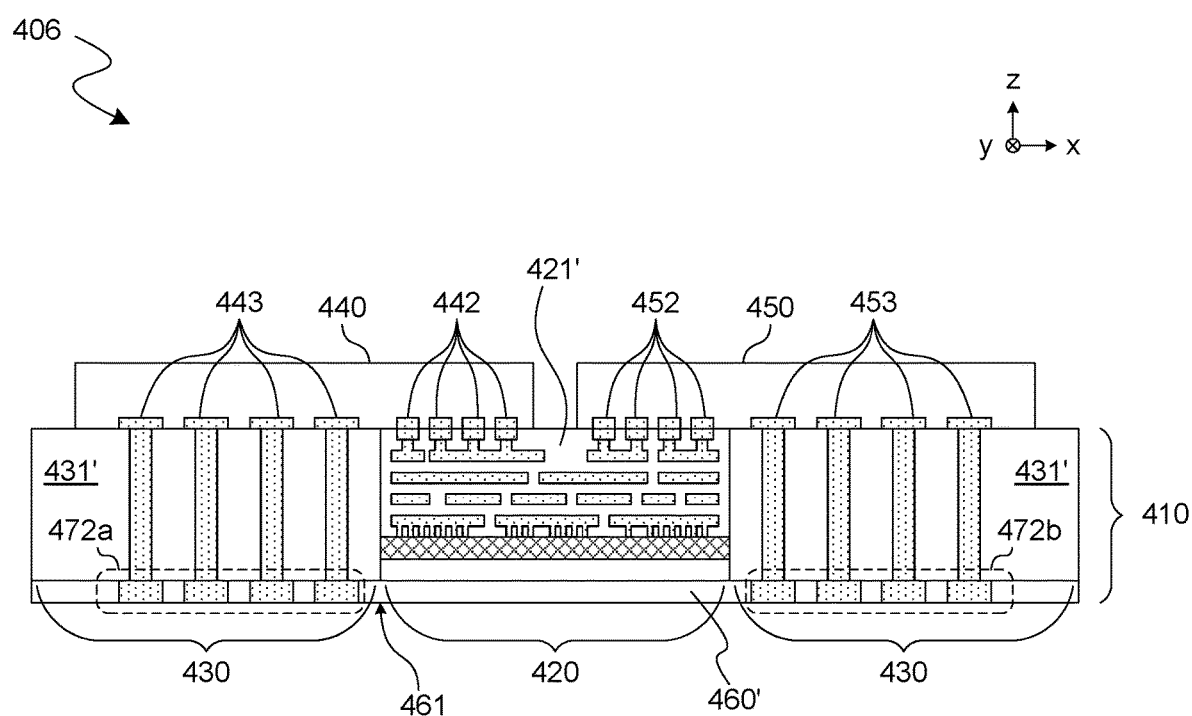

In some embodiments, as shown in FIG. 4G, formation of an interposer further comprises chemical mechanical planarization (CMP), or other suitable processing, to thin substrate 460 at stage 406. Such thinning forms a side 461 of a resulting substrate 460' wherein conductive contacts 472*a* are variously formed by exposing respective portions of via structures 462*a*, and/or wherein conductive contacts 472*b* are variously formed by exposing respective portions of via structures 462*b*. In one such embodiment, a third hardware interface, comprising conductive contacts 472*a* and conductive contacts 472*b*, facilitates coupling of interposer to a package substrate or other host component of a packaged device. In various alternative embodiments, substrate 460' is formed (with conductive contacts 472*a*, 472*b* extending therethrough) before chiplet 420 is disposed thereon. In one such embodiment, a temporary carrier wafer is subsequently removed from side 461'—e.g., through a chemical etch process or through a release layer.

FIG. 5A-5G shows stages 500-505 of fabrication to provide structures of an interposer according to another embodiment. Processing such as that illustrated by stages 500-505 provides features of interposer 110—e.g., where such processing includes some or all of method 200. At the stage 500 shown in FIG. 5A, a chiplet 520 is positioned using a carrier wafer 528 (and/or with a pick-and-place microtool, for example) which is suitable coupling chiplet 520 to a substrate 560.

Chiplet 520 comprises dielectric layers 521, metallization layers 523, a device layer 524, and a semiconductor layer 525 which, for example, variously provide functionality such as that of dielectric layers 421', metallization layers 423', device layer 424', and semiconductor layer 425' (respectively). In contrast with the example configuration of chiplet 420 in interposer 410, portion 520 is oriented so that dielectric layers 521—as compared to device layer 524 and semiconductor layer 525—are relatively close to substrate 560. In one such embodiment, via structures 526 variously extend vertically from metallization layers 523, through device layer 524, and at least partially into semiconductor layer 525—e.g., wherein via structures 526 facilitate a later formation of through silicon via (TSV) structures.

Figure 5A:
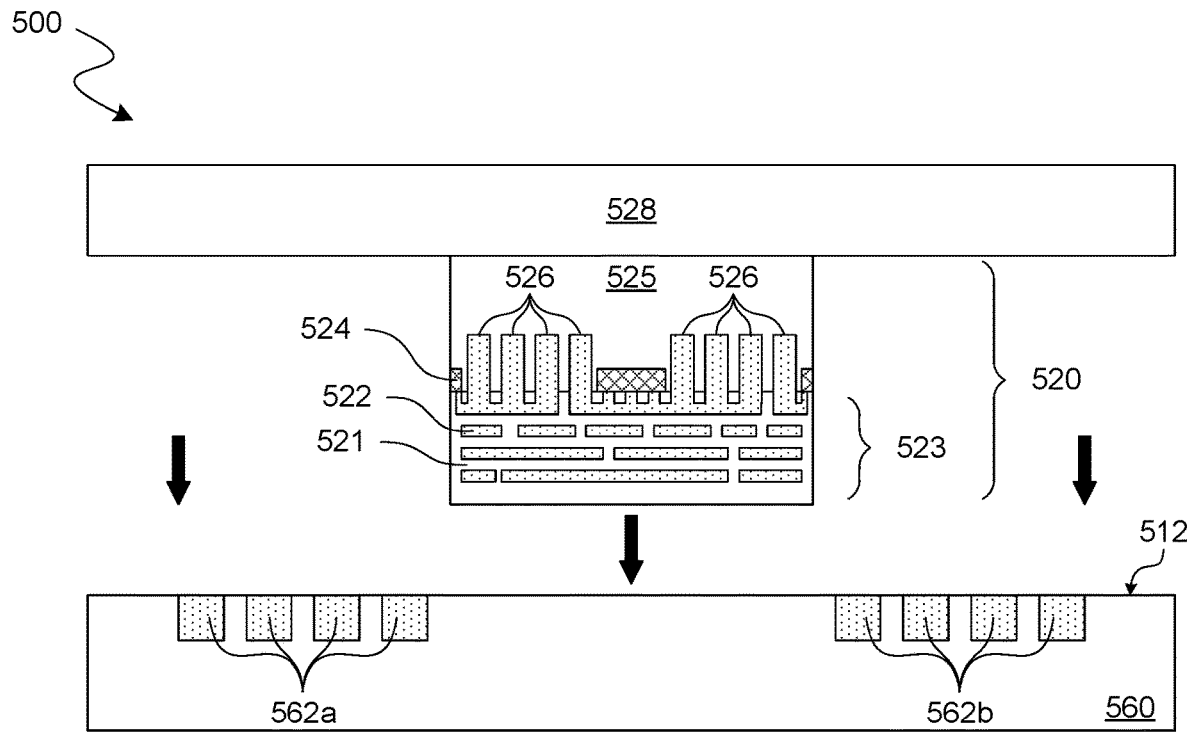
FIGS. 5A-5G are cross-sectional side view diagrams showing stages of processing to provide connectivity with an interposer according to an embodiment.
Figure 5B:
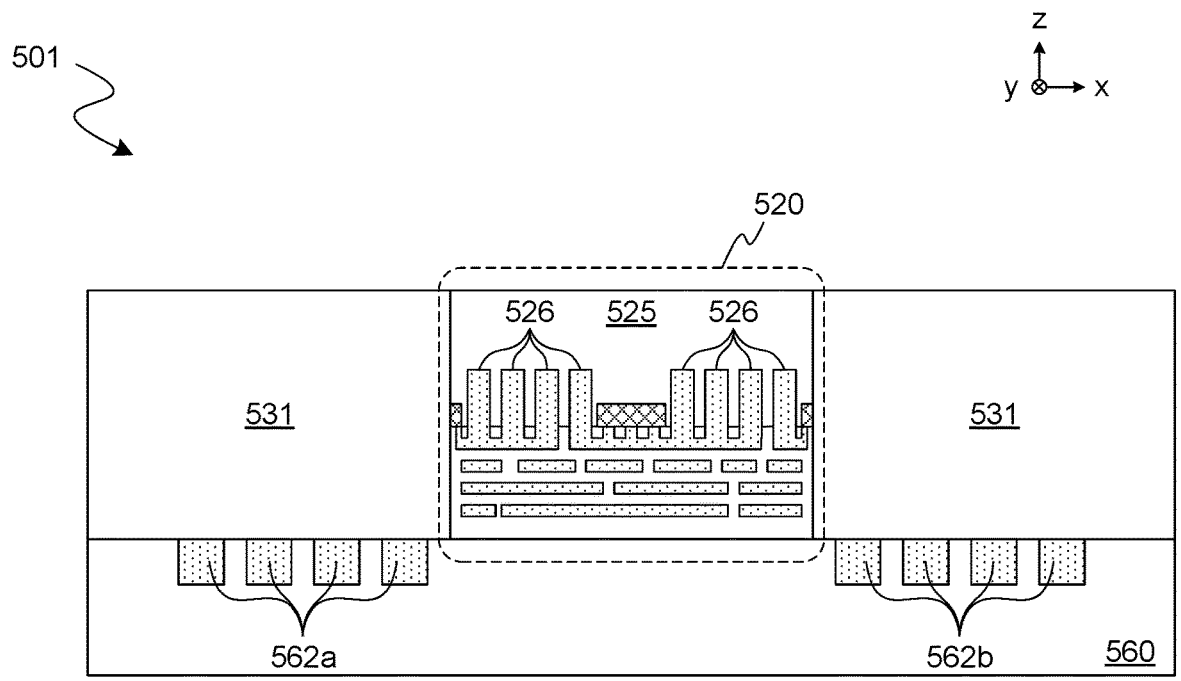
Figure 5C:
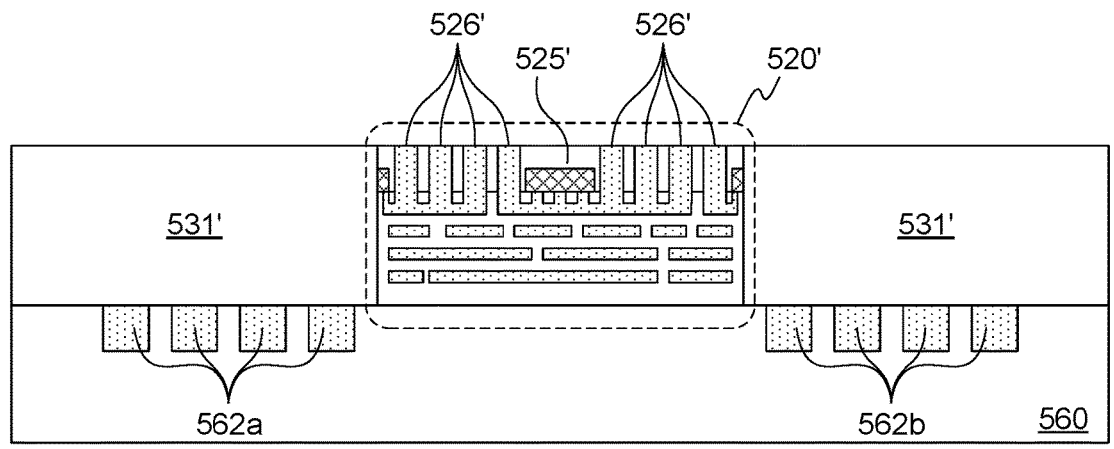

At the stage 501 shown in FIG. 5B, chiplet 520 is bonded to a region of substrate 560 which is between via structures 562*a* and via structures 562*b* that are variously formed in substrate 560. Subsequently, at stage 502, a dielectric material 531 is deposited at one or more sides of (e.g., around) chiplet 520—e.g., where dielectric material 531 covers a backside of substrate 560 and/or encapsulates chiplet 520. Dielectric material 531 includes some or all features of dielectric material 431, for example.

At stage 502, grinding, polishing and/or other planarization thins chiplet 520 from a front side thereof, resulting in a chiplet 520' which includes a remaining semiconductor layer 525' and vias 526' which extend through semiconductor layer 525' to a top side of chiplet 520'. Such planarization also removes portions of dielectric 531 to form insulator structure 531'.

Figure 5D:
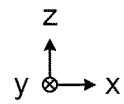
Figure 5D:
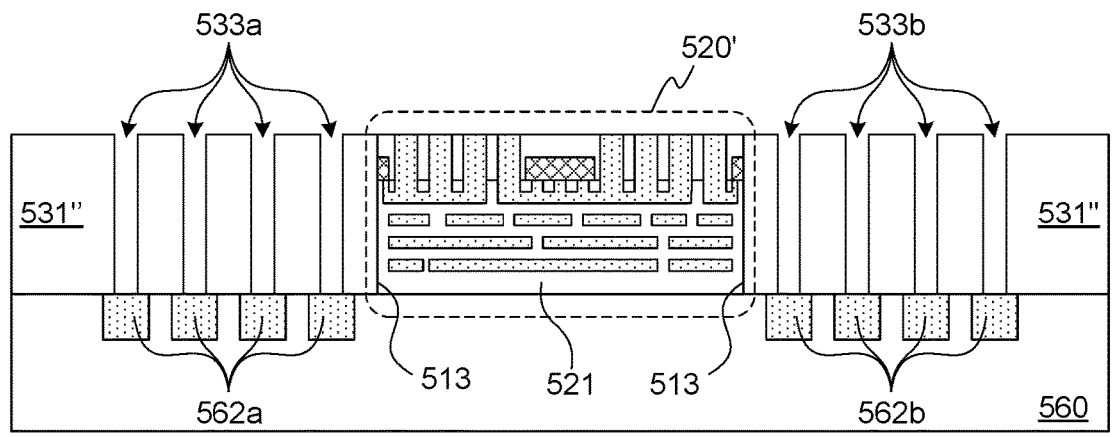
Figure 5E:
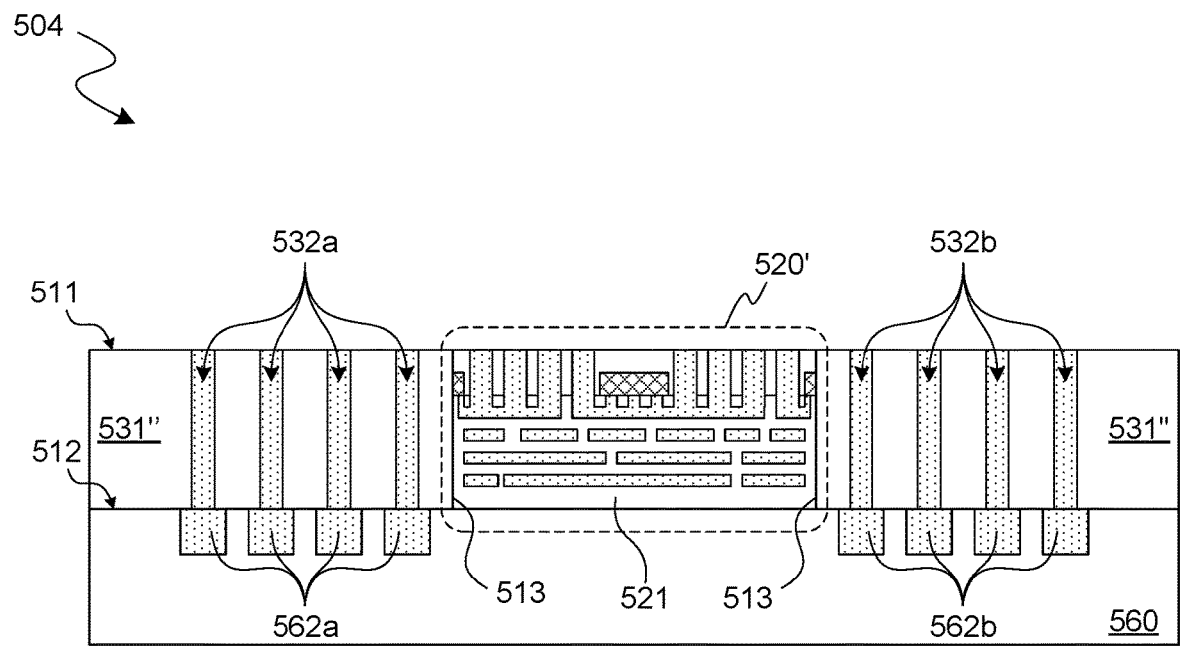
Figure 5F:
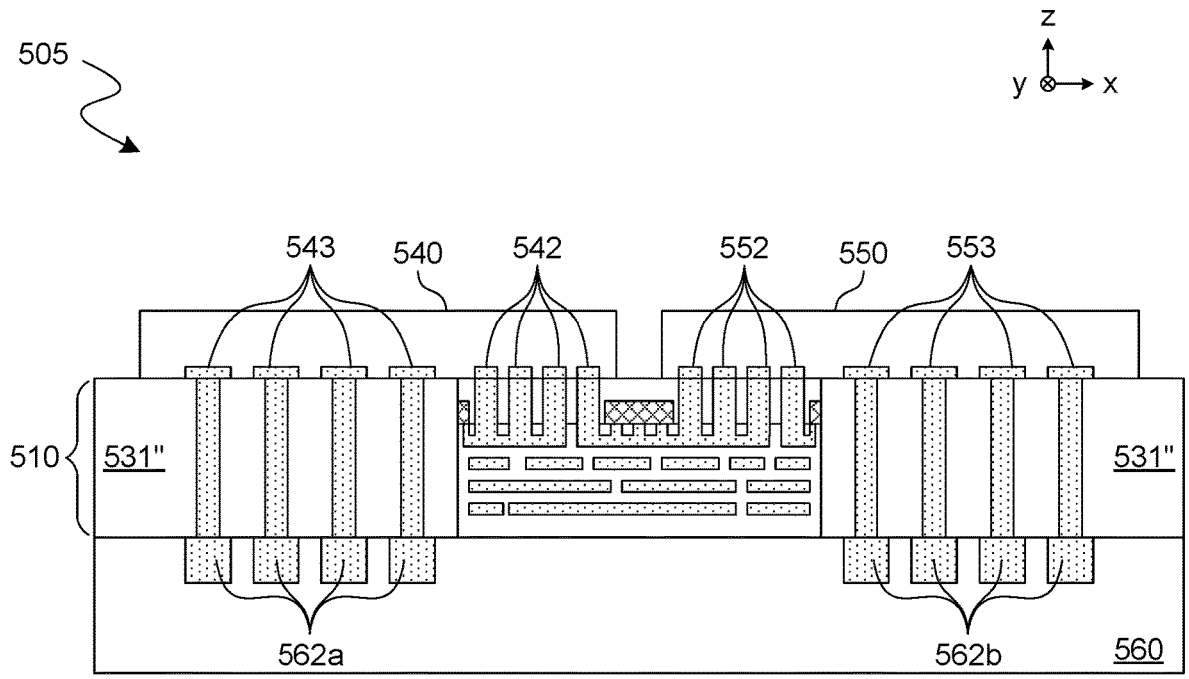

In the stages 503-505 illustrated by FIGS. 5D-5F, additional fabrication processing forms interconnect structures that variously extend along a vertical (z-axis) distance that is also spanned by chiplet 520. By way of illustration and not limitation, at stage 502, an insulator structure 531" is formed from insulator structure 531' by selectively etching and/or otherwise patterning holes 533*a* and holes 533*b*, which variously extend each to expose respective ones of via structures 562*a*, 562*b*. Any of various other suitable metal deposition operations is subsequently performed (at stage 504) to form interconnect structures 532*a* each in a respective one of holes 533*a* and/or to form interconnect structures 532*b* each in a respective one of holes 533*b*.

At stage 504, a material interface 513 is located between chiplet 520 and insulator structure 531", wherein material interface 513 extends from a surface 512 of substrate 560 to a side 511 which is formed at least in part by some or all of insulator structure 531", interconnect structures 532*a*, and interconnect structures 532*b*. In an embodiment, material interface 513 includes or otherwise delimits a maximum horizontal extent (in the x-y plane) of some or all of dielectric layers 521, metallization layers 523, device layer 524, and semiconductor layer 525'.

At stage 505, additional metal deposition forms conductive contacts 543 on interconnect structures 532*a*, conductive contacts 553 on interconnect structures 532*a*, and conductive contacts 542, 552 which each facilitate connectivity with metallization layers 523 of chiplet 520'. A first hardware interface, comprising conductive contacts 542 and conductive contacts 543, enables coupling of an IC chip 540, at side 511. A second hardware interface, comprising conductive contacts 552, 553, enables coupling to another IC chip 550 at side 511.

Figure 5G:
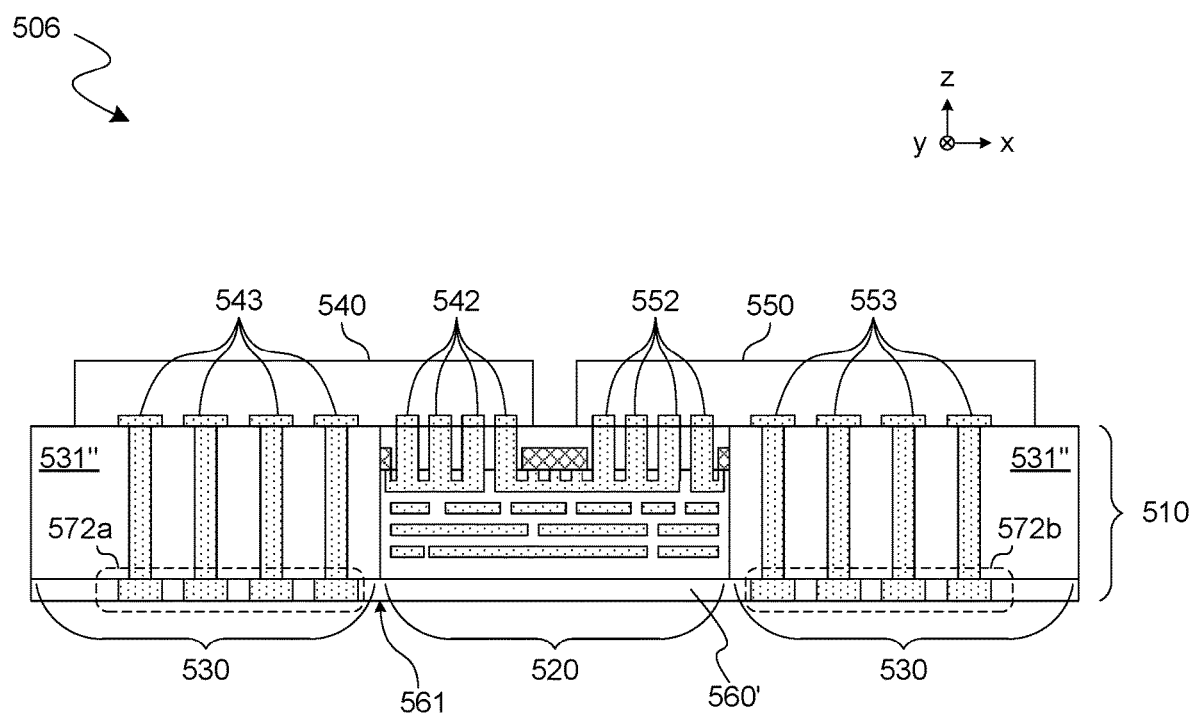

As shown in FIG. 5G, formation of an interposer 510 further comprises chemical mechanical planarization (CMP), or other suitable processing, to thin substrate 560 at stage 506. Such thinning forms a side 561 of a resulting substrate 560' wherein conductive contacts 572*a* are variously formed by exposing respective portions of via structures 562*a*, and/or wherein conductive contacts 572*b* are variously formed by exposing respective portions of via structures 562*b*. A third hardware interface, comprising conductive contacts 572*a* and conductive contacts 572*b*, facilitates coupling of interposer to a package substrate or other host component of a packaged device. In one such embodiment, the third hardware interface comprises additional conductive contacts (now shown) at a bottom side of portion 520 which adjoins substrate 560'. Such additional contacts are electrically coupled to metallization layers 523, for example, and facilitate communication between device layer 524 and a host component, which is to be coupled to interposer 510.

Figure 6:
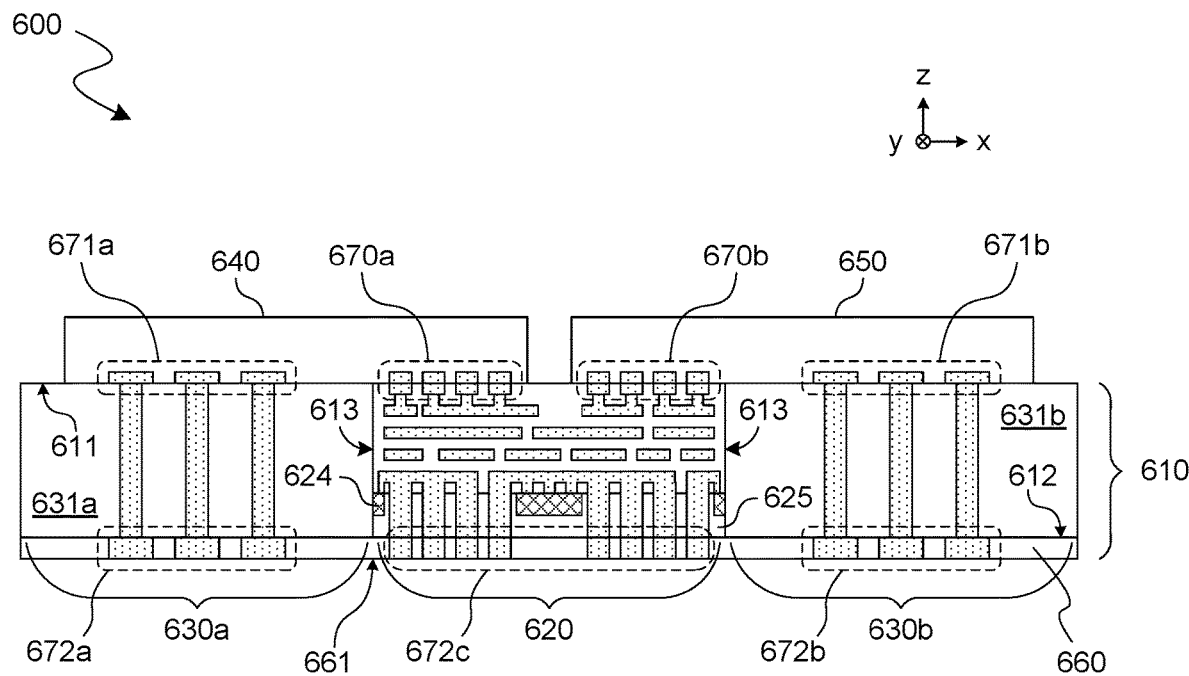
FIG. 6 is a cross-sectional side view diagram showing a circuit device comprising an interposer according to an embodiment.

For example, FIG. 6 shows features of a device 600 including interposer structures according to another embodiment. Device 600 illustrates an embodiment wherein a chiplet of an interposer includes through silicon vias, and/or wherein hardware interface contacts are located on opposite respective sides of said chiplet. In various embodiments, functionality of device 600 is provided according to method 200—e.g., where device 600 includes features of device 100.

As shown in FIG. 6, device 600 comprises an interposer 610 and IC chips 640, 650 which are coupled at a side 611 of interposer 610—e.g., wherein interposer 610, IC chip 640 and IC chip 650 correspond functionally to interposer 110, IC chip 140 and IC chip 150 (respectively). Interposer 610 comprises a substrate 660, and portions 620, 630*a*, 630*b* variously disposed on an opposite side 612 of substrate 660—e.g., wherein portions 620, 630*a*, 630*b* have corresponding features and functionality of portions 120, 130*a*, 130*b* (respectively). For example, an insulator structure 631*a* of portion 630*a* extends to a region of a material interface 613, which is at one sidewall of portion 620—e.g., wherein an insulator structure 631b of portion 630b extends to another region of material interface 613 which is at an opposite sidewall of portion 620. Material interface 613 includes various features of one of material interfaces 113, 313, 413, for example.

A first hardware interface of interposer 610, by which interposer 610 is coupled to IC chip 640, comprises both conductive contacts 670a at portion 620 and conductive contacts 671a at portion 630a. A second hardware interface, by which interposer 610 is coupled to IC chip 650, comprises both conductive contacts 670b at portion 620 and conductive contacts 671b at portion 630b. Interposer 610 further comprises a third hardware interface, at a bottom side 661 of substrate 660, to couple interposer 610 to a package substrate or other host component. For example, conductive contacts 672a of the third hardware interface are electrically coupled, through portion 630a, to contacts 671a—e.g., wherein other conductive contacts 672b of the third hardware interface are electrically coupled, through portion 630b, to contacts 671b.

In some embodiments, the third hardware interface further comprises conductive contacts 672c, which are located in or on a region of side 661 is under portion 620. For example, portion 620 comprises a substrate 625 and a device layer 624 disposed thereon—e.g., wherein devices of device layer 624 are variously coupled between conductive contacts 670a and conductive contacts 670b via metallization layers of portion 620. In one such embodiment, through silicon vias of portion 620 variously extend through substrate 625 to variously couple said metallization layers and/or device layer 624 to conductive contacts 672c. In other embodiments, portion 620 omits device layer 624 (and is merely a passive interposer, for example), or include more than one device layers. In still other embodiments, portion 620 has an opposite vertical (z-axis) orientation—e.g., where device layer 624 is over metallization layers of portion 620, where through-substrate interconnects variously extend through device layer 624 to couple each to a respective one of IC chips 640, 650, and where other interconnects of portion 620 variously extend each to couple to a respective one of contacts 672c.

Figure 7:
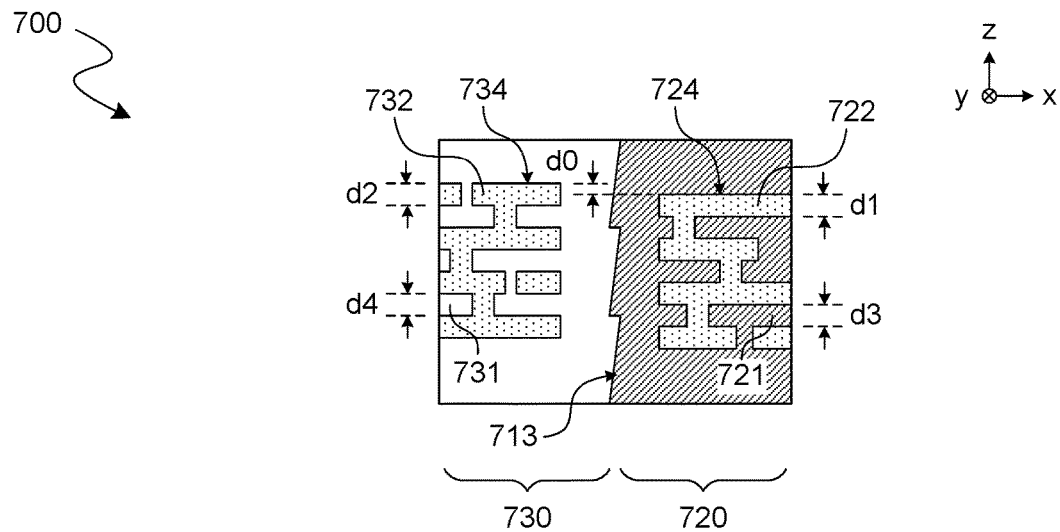
FIG. 7 is a cross-sectional side view diagram showing an interposer comprising a material interface according to an embodiment.

FIG. 7 shows a cross-sectional detail view of an interposer 700 to enable communication between IC chips according to an embodiment. Interposer 700 includes features of one of interposers 110, 310, 410, 510, 610, for example. In an embodiment, functionality of interposer 700 is provided according to some or all operations of method 200.

As shown in FIG. 7, interposer 700 includes a substrate (not shown), and portions 720, 730 which are each disposed thereon—e.g., wherein portion 720 includes some or all features of portion 120 and portion 730 corresponds functionally to one of portions 130a, 130b.

Each of portions 720, 730 comprises a respective insulation structure and respective interconnects variously extending therein. In various embodiments, an inorganic dielectric material of portion 720 which extends to material interface 713 is different than an adjoining inorganic dielectric material of portion 730 which also extends to material interface 713—e.g., wherein portion 720 comprises a low-k dielectric at material interface 713, and where portion 730 comprises a higher-k dielectric at material interface 713.

In some embodiments, material interface 713 alternatively or additionally comprises grooves, scratches, ridges and/or any of various other artefacts of a dicing, cutting, etching, grinding, polishing or other such process that, for example, singulates a chiplet or otherwise forms one or more sidewall structures of portion 720.

Alternatively or in addition, respective metallization structures of portions 720, 730 (and/or respective insulation structures of portions 720, 730) are offset vertically from one another—e.g., wherein said offset is an artefact of process variation between a fabrication of portion 720 and a later fabrication of portion 730. For example, in some embodiments, portion 720 comprises a first metallization layer, wherein portion 730 comprises a second metallization layer which, of any metallization layers of the interconnects of portion 730, is most aligned vertically with the first metallization layer. In one such embodiment, a top (or bottom) side of the first metallization layer is offset vertically from a corresponding top (or bottom) side of the second metallization layer. By way of illustration and not limitation, a metal layer 732 of portion 730 is most aligned vertically (along the z-dimension shown) with a metal layer 722 of portion 720—e.g., wherein metal layers 722, 732 each extend along at least some common vertical span. In one such embodiment, a top side 724 of metal layer 722 is offset vertically from a top side 734 of metal layer 732 by a distance d0—e.g., wherein d0 is at least 5% (for example, at least 10% and, in some embodiments, at least 15%) of one of a thickness d1 of metal layer 722 or a thickness d2 of metal layer 732.

Additionally or alternatively, respective metal layers (or alternatively, respective dielectric layers) of portions 720, 730 share at least some common vertical span, wherein said layers have different respective thicknesses. By way of illustration and not limitation, thickness d2 differs from thickness d1 by at least at least 5% (for example, at least 10% and, in some embodiments, at least 20%) of the thickness d1. Alternatively or in addition, respective dielectric layers 721, 731 of portions 720, 730 share at least some common vertical span, wherein a thickness d3 of dielectric layer 721 differs from a thickness d4 of dielectric layer 731 by at least at least 5% (and in some embodiments, at least 10%) of the thickness d3.

Figure 8:
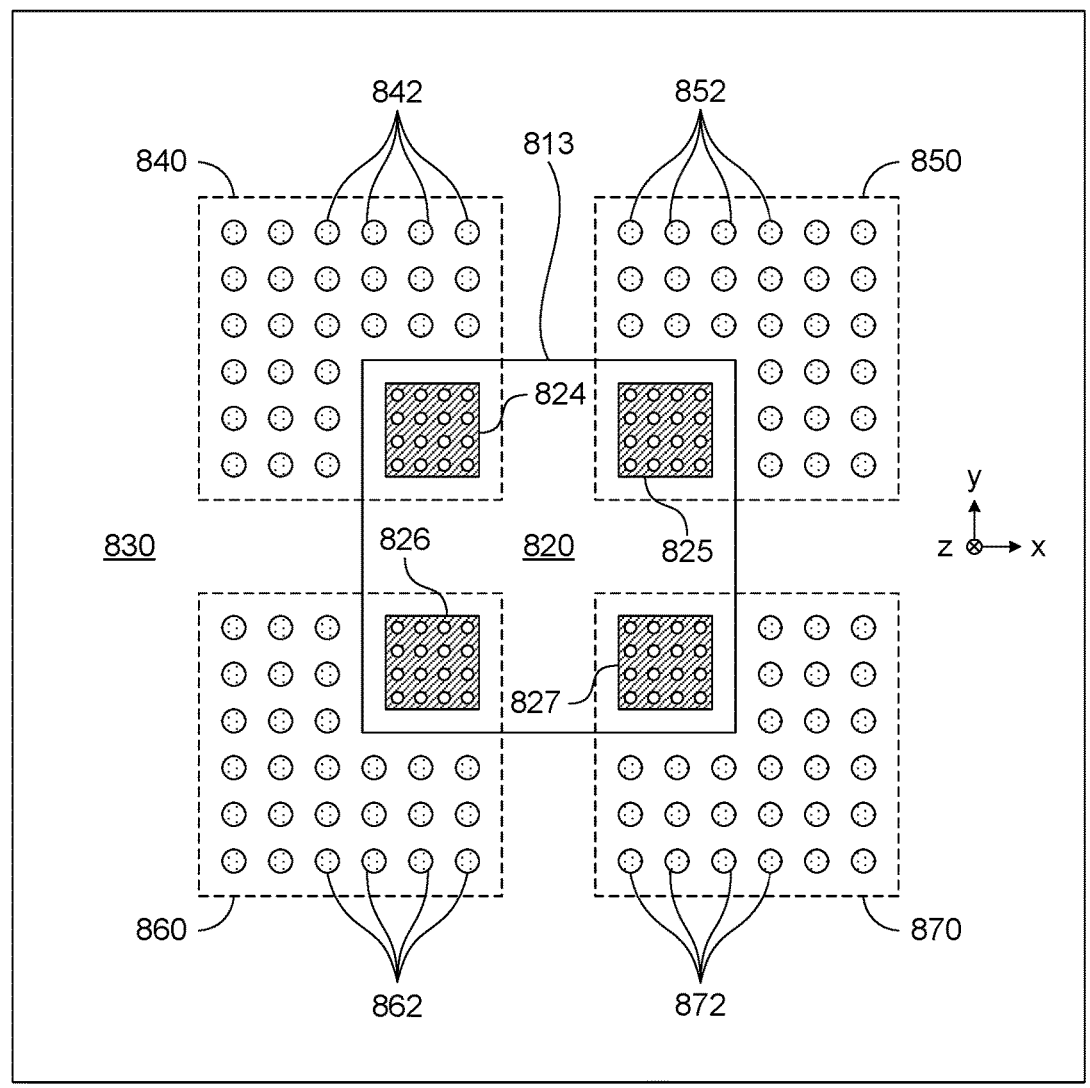
FIG. 8 is a top plan view diagram showing elements of an interposer which provides a relatively small feature pitch to interconnect integrated circuit chips according to an embodiment.

FIG. 8 shows a top side view of a composite interposer 800 according to an embodiment—e.g., wherein the top side is one of sides 111, 311, 411, 511, 611. In various embodiments, functionality of interposer 800 is provided according to method 200. As shown in FIG. 8, interposer 800 includes portions 820, 830 which are each disposed on a substrate (not shown) such as one of substrates 160, 360, 460', 560', 660. In an embodiment, portion 820 includes features of portion 120—e.g., wherein portion 830 corresponds functionally to one or both of portions 130a, 130b. A material interface 813, where portions 820, 830 adjoin each other, extends around portion 820.

Multiple hardware interfaces 840, 850, 860, 870 of interposer 800—each to couple interposer 800 to a different respective IC chip—variously span material interface 813. In the example embodiment shown, hardware interface 840 comprises contacts 842 disposed in or on a top side of portion 830, and contacts 824 at a top side of portion 820—e.g., where hardware interface 850 comprises contacts 852 at portion 830, and contacts 825 at portion 820. Additionally or alternatively, hardware interface 860 comprises contacts 862 at portion 830, and contacts 826 at portion 820—e.g., where hardware interface 870 comprises contacts 872 at portion 830, and contacts 827 at portion 820.

In one such embodiment, interconnect structures of portion 820 variously provide electrical coupling between two or more of hardware interfaces 840, 850, 860, 870. For example, such interconnect structures facilitate communication between contacts 824 and any or all of contacts 825, 826, 827, communication between contacts 825 and any or all of contacts 824, 826, 827, and/or the like. In one such embodiment, interposer 800 further comprises a device layer that, for example, includes router circuitry to selectively route communications between various ones of hardware interfaces 840, 850, 860, 870. Furthermore, interconnect structures of portion 830 variously provide additional electrical coupling of one or more of hardware interfaces 840, 850, 860, 870 each with another hardware interface (not shown) of interposer 800 which is at a bottom side of the underlying substrate.

Figure 9A:
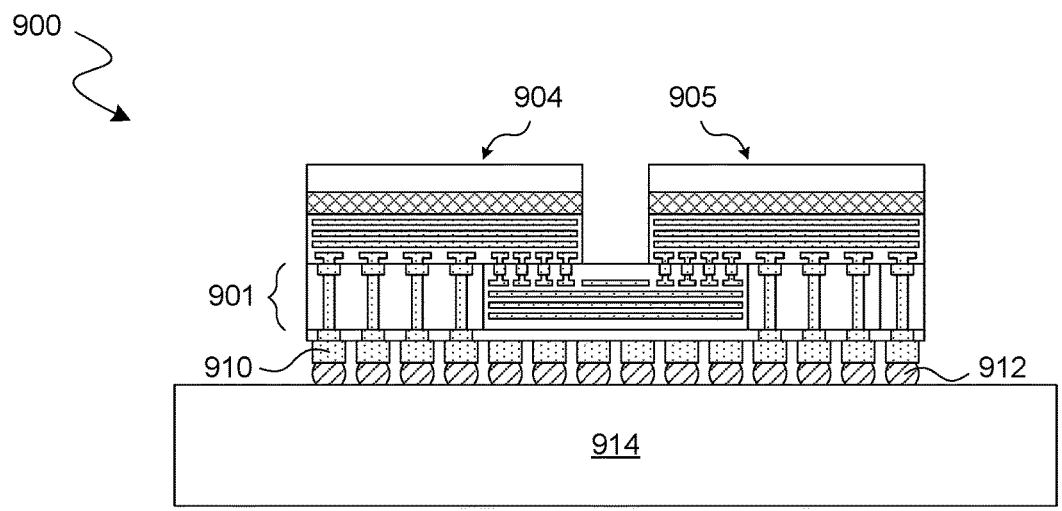
FIGS. 9A and 9B are cross-sectional side view diagrams each showing a corresponding packaged integrated circuit device that includes an interposer according to a respective embodiment.

FIG. 9A illustrates an exemplary packaged IC device 900 that includes a composite interposer, in accordance with some embodiments. In the example embodiment shown, packaged IC device 900 comprises an interposer 901 and IC chips 904, 905 coupled thereto—e.g., wherein interposer 901, IC chip 904 and IC chip 905 include features of interposer 110, IC chip 140 and IC chip 150 (respectively).

In one such embodiment, a hardware interface of interposer 901 comprises first level interconnect (FLI) interface contacts 910 which are attached by FLI solder joints 912 to a host component 914, which may be any interposer or package substrate, for example. For example, FLI solder joints 912 are in contact with FLI interface contacts 910 on a side of FLI interface contacts 910 which is opposite IC chips 904, 905. FLI solder joints 912 may be of any composition (e.g., SAC) and applied by any technique. Non-solder embodiments are also possible where FLI interface contacts 910 are directly bonded (e.g., Cu—Cu bumps) to host component 914. In some embodiments, host component 914 is predominantly silicon.

Other materials known to be suitable as interposers or package substrates may also be employed as host component 914 (e.g., an epoxy preform, etc.). Host component 914 may include one or more metallized redistribution levels (not depicted) embedded within a dielectric material. Host component 914 may also include one or more chiplets embedded therein or attached next to interposer 901. For example, a chiplet (not depicted) may be embedded within the metallized redistribution levels of host component 914.

Figure 9B:
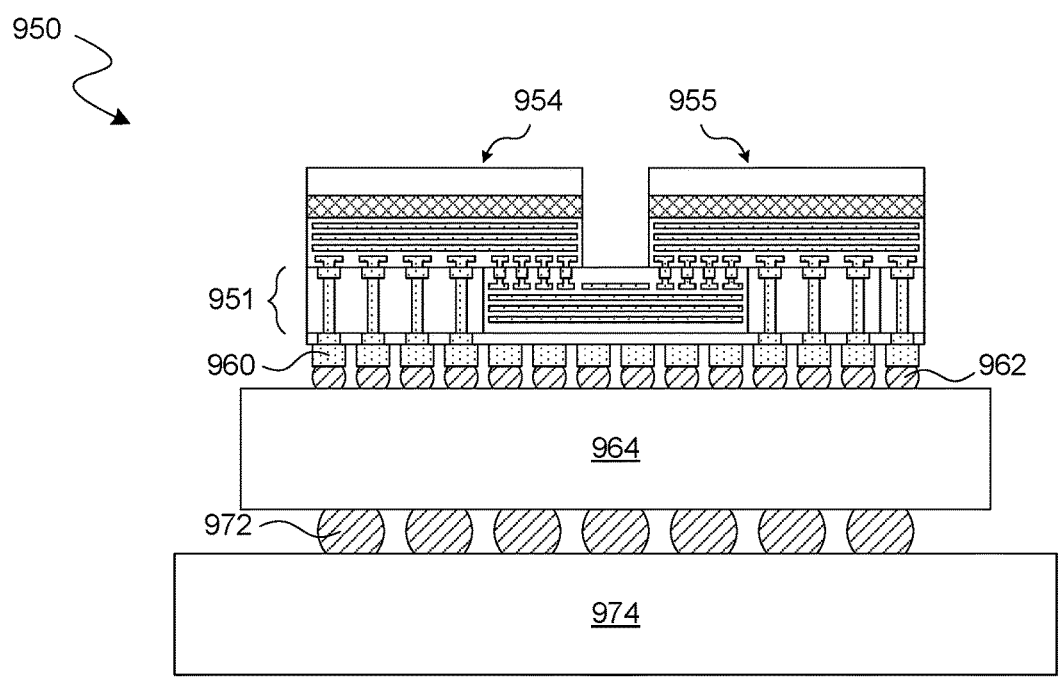

FIG. 9B illustrates an exemplary microelectronic system 950, according to an embodiment, that includes an interposer 951 and IC chips 954, 955 coupled thereto—e.g., wherein interposer 951, IC chip 954 and IC chip 955 include features of interposer 110, IC chip 140 and IC chip 150 (respectively). Interposer 951 and IC chips 954, 955 are further integrated together into an assembly sharing a single host component 964. As shown, host component 964 (e.g., a package substrate) is coupled to FLI interface contacts 960 of interposer 951 by FLI solder joints 962, and is further coupled to a host board 974 by second level interconnect (SLI) solder joints 972. SLI solder joints 972 may comprise any solder (ball, bump, etc.) suitable for a given host board 974 architecture (e.g., surface mount FR4, etc.).

Figure 10:
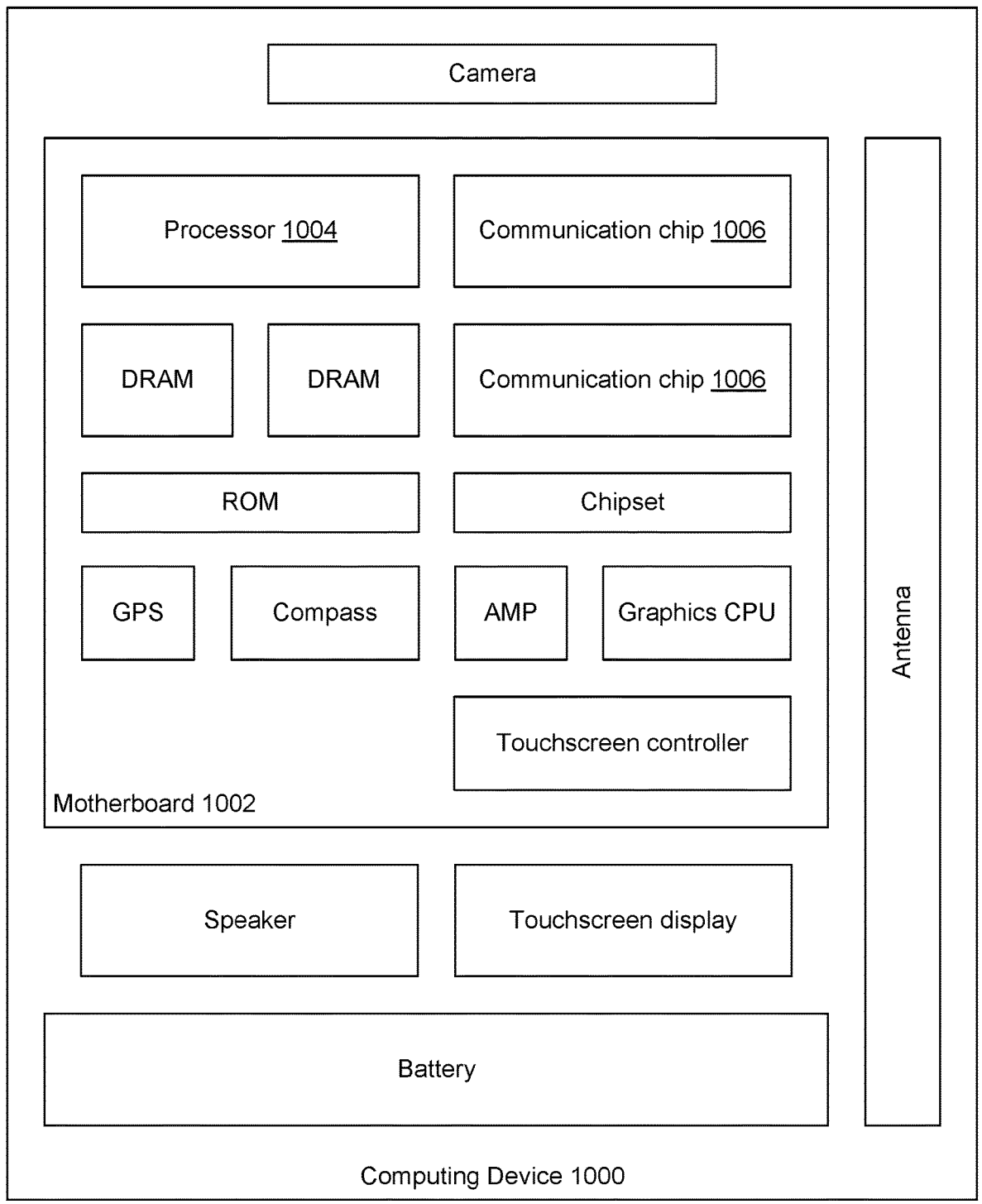
FIG. 10 is a functional block diagram showing a computing device in accordance with one embodiment.

FIG. 10 illustrates a computing device 1000 in accordance with one embodiment. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The term "processor" may refer to any device or portion of a device that processes electronic data from registers and/or memory to transform that electronic data into other electronic data that may be stored in registers and/or memory. The communication chip 1006 also includes an integrated circuit die packaged within the communication chip 1006.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 11:
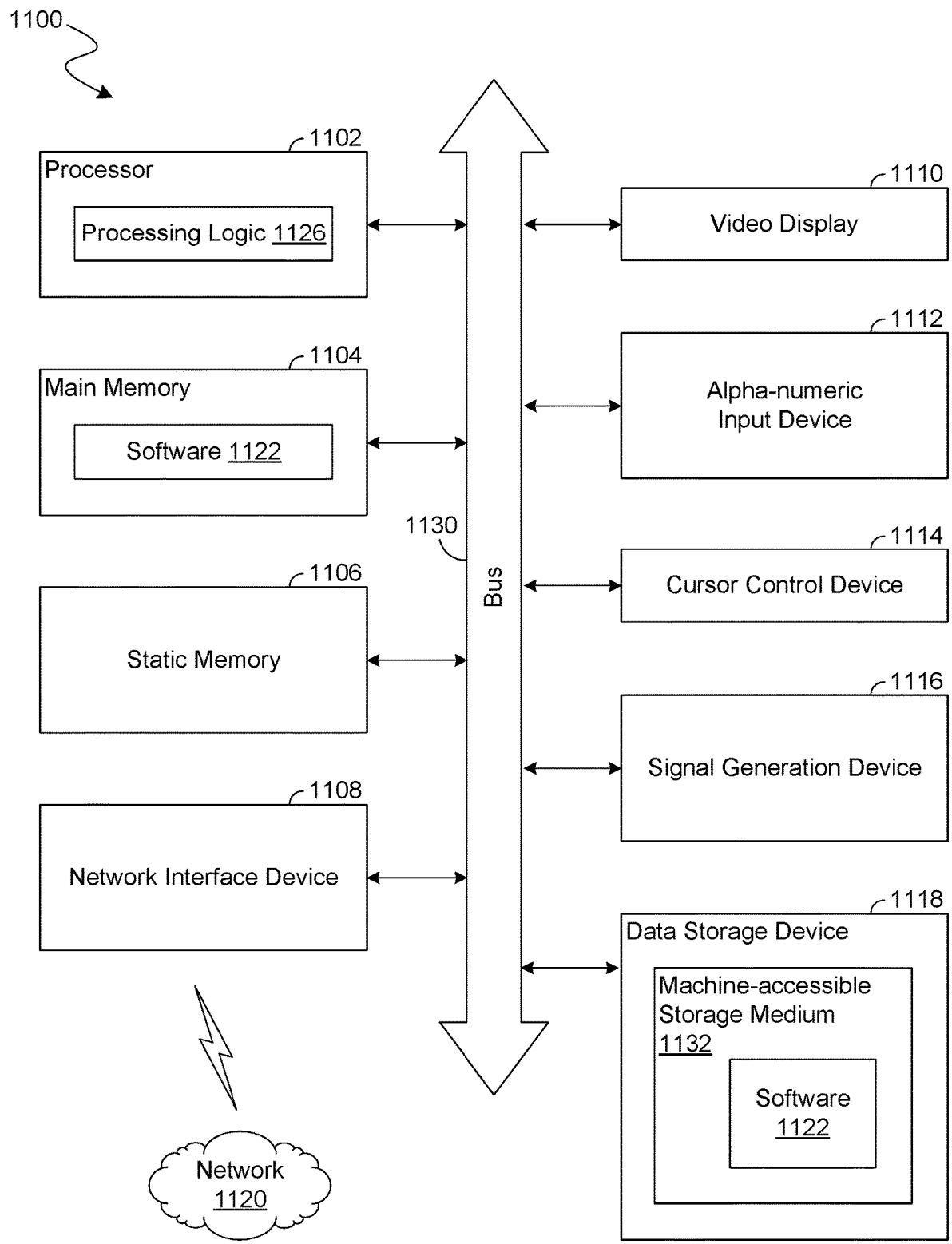
FIG. 11 is a functional block diagram showing an exemplary computer system, in accordance with one embodiment.

FIG. 11 illustrates a diagrammatic representation of a machine in the exemplary form of a computer system 1100 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1100 includes a processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

Processor 1102 represents one or more general-purpose processing devices such as a microprocessor, central processing unit, or the like. More particularly, the processor 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1102 may also be one or more special-purpose processing devices such as an application specific integrated circuit (ASIC), a field programmable gate array (FPGA), a digital signal processor (DSP), network processor, or the like. Processor 1102 is configured to execute the processing logic 1126 for performing the operations described herein.

The computer system 1100 may further include a network interface device 1108. The computer system 1100 also may include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium (or more specifically a computer-readable storage medium) 1132 on which is stored one or more sets of instructions (e.g., software 1122) embodying any one or more of the methodologies or functions described herein. The software 1122 may also reside, completely or at least partially, within the main memory 1104 and/or within the processor 1102 during execution thereof by the computer system 1100, the main memory 1104 and the processor 1102 also constituting machine-readable storage media. The software 1122 may further be transmitted or received over a network 1120 via the network interface device 1108.

While the machine-accessible storage medium 1132 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for providing coupling between IC chips are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An interposer comprising:
   a substrate comprising an inorganic material;
   a first insulator structure and first interconnects therein; and
   a second insulator structure and second interconnects therein, wherein respective inorganic dielectrics of the first insulator structure and the second insulator structure adjoin each other at a material interface, which extends to each of the substrate and a first side of the interposer;
   wherein a first hardware interface, to couple the interposer to a first IC chip, spans the material interface at the first side;
   wherein a second hardware interface, to couple the interposer to a second IC chip, includes contacts, at a first surface of the first insulator structure, which are coupled to the first hardware interface via the first interconnects; and
   wherein a third hardware interface, at a second side of the interposer opposite the first side, is coupled to the first hardware interface via the second interconnects.

2. The interposer of claim 1, wherein the first hardware interface comprises:
   first contacts at the first surface; and
   second contacts at a second surface of the second insulator;
   wherein a first metallization feature pitch of the first contacts is smaller than a corresponding second metallization feature pitch of the second contacts.

3. The interposer of claim 2, wherein the second hardware interface comprises:
   third contacts at the first surface; and
   fourth contacts at the second surface;
   wherein the third hardware interface further comprises fifth contacts and sixth contacts, wherein the second interconnects are electrically coupled each between a respective one of the second contacts and a respective one of the fifth contacts, and wherein the interposer further comprises third interconnects in the second insulator structure, the third interconnects are electrically coupled each between a respective one of the fourth contacts and a respective one of the sixth contacts.

4. The interposer of claim 1, wherein the material interface comprises an artifact of one of a cut process, an etch process, a grind process, or a polish process.

5. The interposer of claim 1, wherein, at the first side, the first insulator comprises an artifact of one of a cut process, an etch process, a grind process, or a polish process.

6. The interposer of claim 1, wherein the first interconnects comprise a first metallization layer, wherein the second interconnects comprises a second metallization layer which, of any metallization layers of the second interconnects, is most aligned vertically with the first metallization layer, wherein a side of the first metallization layer is offset vertically from a corresponding side of the second metallization layer.

7. The interposer of claim 1, wherein a first dielectric material of the first insulator structure and a second dielectric material of the second insulator structure, the first dielectric material other than the second dielectric material, each extend to the material interface.

8. The interposer of claim 7, wherein the first dielectric material comprises a low-k dielectric.

9. The interposer of claim 1, further comprising active circuit components between the substrate and the first insulator structure, the active circuit components coupled, via the first interconnects, between the first hardware interface and the second hardware interface.

10. The interposer of claim 1, further comprising a semiconductor substrate between the first insulator structure and the substrate, wherein one of the first interconnects further extends through the semiconductor substrate.

11. A method comprising:
    forming a first insulator structure and first interconnects therein, including bonding a chiplet to a substrate which comprises an inorganic material; and
    forming on the substrate a second insulator structure and second interconnects therein, wherein respective inorganic dielectrics of the first insulator structure and the second insulator structure adjoin each other at a material interface which extends to each of the substrate and a first side of an interposer which comprises the substrate, the first insulator structure, the insulator structure, the first interconnects, and the second interconnects;
    wherein a first hardware interface of the interposer, to couple the interposer to a first IC chip, spans the material interface at the first side;
    wherein a second hardware interface of the interposer, to couple the interposer to a second IC chip, includes contacts, at a first surface of the first insulator structure, which are coupled to the first hardware interface via the first interconnects; and
    wherein a third hardware interface of the interposer, at a second side of the interposer opposite the first side, is coupled to the first hardware interface via the second interconnects.

12. The method of claim 11, wherein the first hardware interface comprises:
    first contacts at the first surface; and
    second contacts at a second surface of the second insulator;
    wherein a first metallization feature pitch of the first contacts is smaller than a corresponding second metallization feature pitch of the second contacts.

13. The method of claim 11, wherein the material interface comprises an artifact of one of a cut process, an etch process, a grind process, or a polish process.

14. The method of claim 11, wherein the first interconnects comprise a first metallization layer, wherein the second interconnects comprises a second metallization layer which, of any metallization layers of the second interconnects, is most aligned vertically with the first metallization layer, wherein a side of the first metallization layer is offset vertically from a corresponding side of the second metallization layer.

15. The method of claim 11, wherein a first dielectric material of the first insulator structure and a second dielectric material of the second insulator structure, the first dielectric material other than the second dielectric material, each extend to the material interface.

16. A system comprising:
an interposer comprising:
  a substrate comprising an inorganic material;
  a first insulator structure and first interconnects therein; and
  a second insulator structure and second interconnects therein, wherein respective inorganic dielectrics of the first insulator structure and the second insulator structure adjoin each other at a material interface, which extends to each of the substrate and a first side of the interposer;
a first IC chip coupled to the interposer via a first hardware interface which spans the material interface at the first side;
a second IC chip coupled to the interposer via a a second hardware interface comprising contacts, at a first surface of the first insulator structure, which are coupled to the first hardware interface via the first interconnects; and
a circuit board coupled to the interposer via a third hardware interface, at a second side of the interposer opposite the first side, which is coupled to the first hardware interface via the second interconnects.

17. The system of claim 16, wherein the first hardware interface comprises:
  first contacts at the first surface; and
  second contacts at a second surface of the second insulator;
  wherein a first metallization feature pitch of the first contacts is smaller than a corresponding second metallization feature pitch of the second contacts.

18. The system of claim 16, wherein the first interconnects comprise a first metallization layer, wherein the second interconnects comprises a second metallization layer which, of any metallization layers of the second interconnects, is most aligned vertically with the first metallization layer, wherein a side of the first metallization layer is offset vertically from a corresponding side of the second metallization layer.

19. The system of claim 16, wherein a first dielectric material of the first insulator structure and a second dielectric material of the second insulator structure, the first dielectric material other than the second dielectric material, each extend to the material interface.

20. The system of claim 16, further comprising active circuit components between the substrate and the first insulator structure, the active circuit components coupled, via the first interconnects, between the first hardware interface and the second hardware interface.

* * * * *